(12) United States Patent
Ryhänen et al.

(10) Patent No.: US 6,744,335 B2
(45) Date of Patent: Jun. 1, 2004

(54) MICROMECHANICAL TUNABLE CAPACITOR AND AN INTEGRATED TUNABLE RESONATOR

(75) Inventors: Tapani Ryhänen, Helsinki (FI); Mikael Lind, Helsinki (FI); Vladimir Ermolov, Helsinki (FI); Samuli Silanto, Helsinki (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/783,059

(22) Filed: Feb. 14, 2001

(65) Prior Publication Data

US 2002/0135440 A1 Sep. 26, 2002

(30) Foreign Application Priority Data

Feb. 16, 2000 (FI) .............................................. 20000339

(51) Int. Cl.[7] .............................. H01P 1/20; H03H 7/00
(52) U.S. Cl. ........................ 333/185; 333/174; 333/262
(58) Field of Search ........................... 334/80; 333/174, 333/101, 185, 219, 262; 361/278

(56) References Cited

U.S. PATENT DOCUMENTS

| 5,166,646 A | | 11/1992 | Avanic et al. ............... 331/107 |
|---|---|---|---|
| 5,526,172 A | | 6/1996 | Kanack ...................... 359/291 |
| 5,531,128 A | | 7/1996 | Ryhänen ................. 73/862.623 |
| 5,539,241 A | * | 7/1996 | Abidi et al. ................. 257/531 |
| 5,561,523 A | | 10/1996 | Blomberg et al. ........... 356/352 |
| 5,646,729 A | | 7/1997 | Koskinen et al. ............ 356/352 |
| 5,679,902 A | | 10/1997 | Ryhänen ...................... 73/718 |
| 5,818,586 A | | 10/1998 | Lehto et al. ................. 356/346 |
| 6,049,702 A | * | 4/2000 | Tham et al. ................... 455/78 |
| 6,074,890 A | * | 6/2000 | Yao et al. ...................... 438/52 |
| 6,127,908 A | * | 10/2000 | Bozler et al. ............... 333/246 |

FOREIGN PATENT DOCUMENTS

| EP | 0725408 A2 | 8/1996 |
|---|---|---|
| JP | 9-082569 | 3/1997 |
| WO | WO 00/42705 | 7/2000 |

OTHER PUBLICATIONS

"Micromachined Electro–Mechanically Tunable Capacitors and Their Applications to RF IC's", Dec et al., IEEE Transactions on Microwave Theory and Techniques, vol. 46, No. 12, Dec. 1998, pp. 2587–2596.
"RF MEMs Variable Capacitors for Tunable Filters", Goldsmith et al., Inc. Int. J RF and Microwave CEA 9, John Wiley & Sons, 1999, pp. 362–374.
"Characteristics of Micromachined Switches at Microwave Frequencies", Goldsmith et al., Dig. IEEE MTT–S, 1996, pp. 1141–1144.
"Micromachined Low–Loss Microwave Switches", Yao et al., IEEE Journal of Microelectromechanical Systems, vol. 8, No. 2, Jun. 1999, pp. 129–134.
"A Micromachined Variable Capacitor for Monolithic Low–Noise VCOs", Young et al., Solid–State Sensors and Actuators Workshop, 1996, pp. 86–89.
"Development of a Wide Tuning Range MEMS Tunable Capacitor for Wireless Communication Systems", Zou et al., IEEE 2000, pp. 17.2.1–17.2.4.
"A Micromachined, Single–Crystal Silicon, Tunable Resonator", Yao et al., Micromach. Microeng., 1996, pp. 257–264.

* cited by examiner

Primary Examiner—Robert Pascal
Assistant Examiner—Dean Takaoka
(74) Attorney, Agent, or Firm—Perman & Green, LLP

(57) ABSTRACT

An integrated tunable resonator for radio includes an RF resonator having a micromechanical tunable capacitor with high Q- (quality factor) value. A first conducting layer (4) forms the first capacitor electrode (8), and/or the electrodes (9) to create the electrostatic force on a movable micromechanical structure (2), and the interconnecting wire (10) between the inductor coil (1) and the capacitor electrode. This arrangement with the use of a dielectric insulating layer provides a substantial improvement to the linearity, power consumption, occupation space and reliability of RF resonator circuits.

33 Claims, 19 Drawing Sheets

415 POLYSILICON DEPOSITION (2-5μm), DOPING, ANNEALING AND PATTERNING; (PolySi:<5Ω/□; TENSILE RESIDUAL STRESS: 10MPa)

416 SILICON NITRIDE DEPOSITION (0.3μm)

417 SILICON NITRIDE PATTERNING (PLASMA)

418 SEED METAL DEPOSITION AND PATTERNING 500 nm Au
300 nm SiN
800 nm SiO$_2$
500 nm TiW
1 μm SiN
1 μm SiO$_2$

MICROMECHANICAL TUNABLE CAPACITOR AND AN INTEGRATED TUNABLE RESONATOR

TECHNICAL FIELD OF THE INVENTION

The invention relates to a micromechanical tunable capacitor and an integrated tunable resonator. In particular the invention relates to an RF resonator realised with a micromechanical tunable capacitor with improved tuning range and high Q-(Quality factor) value.

BACKGROUND OF THE INVENTION

Integrated LC tank circuits are basic building blocks for IC integrated filters, oscillators and matching circuits. Prior art RF resonators typically employ various LC designs where an inductor (L) and a capacitor (C) are connected in series or in parallel. Integrated tunable RF resonators in accordance with the prior art usually comprise an integrated inductor and a micromechanical or a varactor based tunable capacitor.

Prior art fabrication technologies have been optimized for low frequency (<1 MHz) applications and used mainly for inertial and pressure sensors. The design of micromechanical RF components for 1 to 5 GHz applications used in mobile terminals sets demands on micromachined structures. These demands are partly different from the problems in the low frequency Micro Electromechanical Systems (MEMS) applications. In order to create an integrated high Q value LC tank circuit the series resistance and the substrate losses in the inductor-capacitor system must be minimized. Tunability of the LC resonator furthermore requires that the instability of the electromechanical system is taken into account in the structure design and that the parasitic capacitance is minimized in the overall structure. The MEMS RF components must therefore be optimized with respect to following constraints:

- the tuning range should give more than 15% resonance frequency change when the capacitance value changes over 50% which can be obtained by simultaneously
  1) minimizing the parasitic capacitance to less than 1 pF, and
  2) eliminating the electromechanical instabilities,
- the series resistance must be minimized to a value smaller than 1 ohm,
- the temperature dependencies must be minimized,
- the vibration and acceleration sensitivity must be minimized, The major limitation for the tuning range of the micromechanical capacitors is the instability of the electromechanical system. FIG. 1 demonstrates the deflection of the flexible capacitor plate as a function of the voltage U across the capacitor plates. The flexible capacitor plate deflects towards the fixed electrode until the electrostatic force due to its non-linear dependence on the plate distance exceeds the maximum possible mechanical spring counter force, and the capacitor plates collapse together at this particular critical voltage value $U_{pull-in}$, called pull-in voltage.

FIG. 2 illustrates a simple piston structure with a spring κ and a mass m, and parallel capacitor plates $C_a$ and $C_b$, wherein the pull-in happens independent of the dimensions when the displacement x of the capacitor plate is one third (33%) of the original distance x0 between the capacitor plates. For deflecting beam or diaphragm, the deflection can be slightly larger as seen in FIG. 1. Furthermore, after the pull-in has happened the capacitor plates can be separated only by decreasing the voltage significantly below the release voltage as shown in FIG. 1. The pull-in effect limits the maximum relative change in the capacitance below 50%.

Prior art micromechanical capacitors and integrated RF resonators based on them have therefore disadvantages related to those requirements. The achieved tuning range of prior art micromechanical capacitors is inadequate to many applications. Series resistance and parasitic capacitance are also high in prior art RF resonators based on tunable micromechanical capacitor and integrated planar inductor. In addition, prior art RF circuits suffer from temperature dependence, due to the mismatch of thermal expansion coefficients of the micromechanical structure and the substrate. These factors may severely limit the tuning range and lead to high losses, thermal unstability and unreliability of the micromechanical capacitors and RF resonators.

SUMMARY OF THE INVENTION

The purpose of the invention is to achieve improvements related to the aforementioned disadvantages. The arrangement for micromechanical tunable capacitor and an integrated RF resonator based on it in accordance with the invention presents a micromechanical tunable capacitor and integrated resonator that facilitate a significant increase in the tuning range and minimizing the series resistance, parasitic capacitance and temperature dependence. Hence, the invention presents a substantial improvement to the tuning range, quality factor, stability and reliability of the micromechanical tunable capacitor and the RF resonator based on it.

The aforementioned advantages of the invention are preferably implemented with a micromechanical tunable capacitor with a movable electrode and two-piece electrode structure where the active electrode and the tuning electrode are separate. The two different electrodes may also have different gap heights, meaning that the gap height between the tuning electrodes and the electrode beam is different from the gap height between the active electrode and the beam. With the two-piece electrode structure it is possible to achieve a large relative shift between the active electrodes without the pull-in effect. The electrode forming the circuit capacitance is here called the active electrode.

A resonator according to the invention is preferably implemented with such a micromechanical tunable capacitor integrated on the same substrate with an integrated inductor coil. An integrated coil is preferably a planar coil; however, also integrated solenoid or toroid coils are possible.

The inventive concept of a micromechanical tunable capacitor can advantageously be realised with a movable electrode and a two-piece electrode structure, where the active electrode and the tuning electrodes are separate, using one or several of the following details:

- divided electrode structure with variable gap height to improve the tuning range of the variable capacitor. The two different electrodes may have different gap heights;
- use of metal thin films to reduce the serial resistance in the capacitor structure down to the 0.1 ohm level;
- reduction of the parasitic capacitance by using the diaphragm or the doubly-supported beam as a ground electrode, i.e., the diaphragm or the beam is connected to the same electrical potential as the substrate. The fixed (anchor) parts of the micromechanical structure are thus not creating any parasitic capacitance, and the tuning range can be improved;
- reduction of the parasitic capacitance by removing the substrate under that part of the capacitor structure that is forming actual variable capacitance. It is advantageous to remove the substrate only under the capacitor electrode, not under the film anchors and the tuning electrodes, to have mechanically a more robust structure. The substrate removal can be done by either isotropic or anisotropic etching; and the etching can be done from either front or back side of the wafer;

corrugating the diaphragm or the doubly-supported beam to reduce the effect of the stress induced by the mismatch of the thermal expansion coefficients of the micromechanical structure and the substrate;

metal film beam or diaphragm is preferably corrugated by two or more folds so that the depth of the fold is more than the thickness of the metal film. Preferably the depth of the corrugation is over 10 times the thickness of the film; and vertical sides of the folds of the corrugated film are preferably thinner than the lateral portions of the film. The vertical sides of the folds are also preferably weakened by etching holes through the vertical portions of the film.

The inventive concept of a RF resonator that is based on a integrated inductor and a micromechanical tunable capacitor can advantageously be realised with a capacitor with a movable electrode and a two-piece electrode structure, where the active electrode and the tuning electrode are separate, using one or several of the following details:

using the same conductor layer that forms the lower capacitor electrode as an interconnecting wire between the capacitor and the inductor coil. This enables the minimization of the series resistance between the coil and the inductor and reduces the number of necessary contacts between different metal layers;

using the same conductor layer that forms the upper capacitor electrode (ground plate) to create the inductor coil. The same conductor layer can be used as a basis for thick electroplated metallization by deposit a very thin electroplating seed layer on top of it or by using the layer itself as a seed layer for electroplating. Electroplated inductor coil minimizes the series resistance; and reduction of the parasitic capacitance in the coil by removing the substrate (at least partly) under the coil. The substrate removal is done at the same time when the substrate is removed under the capacitor electrode.

The features of the inventive RF resonator structure give several advantages over the prior art solutions:

The parasitic capacitance of the total structure of planar coil and micromechanical capacitor with respect of the substrate is low (below 1 pF). This makes a wide frequency (or capacitance) tuning range possible;

The series resistance is low (below 1 ohm) because of the short interconnection and low resistivity thin films;

The thermal dependence is low because of the corrugated film structures;

Large tuning range because of the electrode geometries and low parasitic capacitance. The capacitance tuning range can be higher than 50%, and a resonance frequency tuning range over 15% can be achieved with 3–5 V control voltage;

When the substrate is removed only at the location of the capacitor electrode, the mechanical performance of the structure is predictable and repeatable due to a rigid structure.

The invention can be implemented utilizing new fabrication technologies that are commonly known as micro system technologies (MST) or Micro Electromechanical Systems (MEMS). These fabrication technologies enable the fabrication of movable structures on top of the silicon wafer based, e.g., on polysilicon or metal films. The preferred process is based on the deposition of a sacrificial material layer (silicon dioxide or polymer film) under the movable structure during the fabrication. During the final steps of fabrication the mechanical structure is released by etching the sacrificial layer away.

An integrated tunable RF resonator according to the invention, comprising a planar integrated inductor and a micromechanical tunable capacitor connected in series or in parallel, comprising a substrate, a first conducting layer for forming a first capacitor electrode, a second conducting layer for forming a second capacitor electrode, a third conducting layer for forming at least part of the planar inductor coil, a dielectric insulating layer between said first conducting layer and third conducting layer, is characterized in that the second capacitor electrode is movable relative to the first capacitor electrode, and the capacitor further comprises electrodes for applying a control voltage in order to create an electrostatic force to the movable first electrode for tuning the capacitance of the capacitor.

The invention is further characterised by an micromechanical tunable capacitor in accordance with the invention, comprising at least one counter electrode on one plate of the capacitor, and at least one active electrode and at least one tuning electrode on the other capacitor plate, which is characterised in that at least one of the capacitor plates is arranged to be a flexible and elastic structure, the active electrode is arranged to be positioned further from clamped points and/or sides than at least one tuning electrode.

The invention is further characterised by an micromechanical tunable capacitor, comprising at least one counter electrode on one plate of the capacitor, and at least one active electrode and at least one tuning electrode on the other capacitor plate, which is characterised in that, the dielectric gap is arranged to be narrower between at least one active electrode and at least one counter electrode than between at least one tuning electrode and at least one counter electrode.

Preferred embodiments of the invention are described in the dependent claims.

BRIEF DESCRIPTION OF THE DRAWINGS

Next the invention will be described in greater detail with reference to exemplary embodiments in accordance with the accompanying drawings, in which.

DETAILED DESCRIPTION

Figure 1:
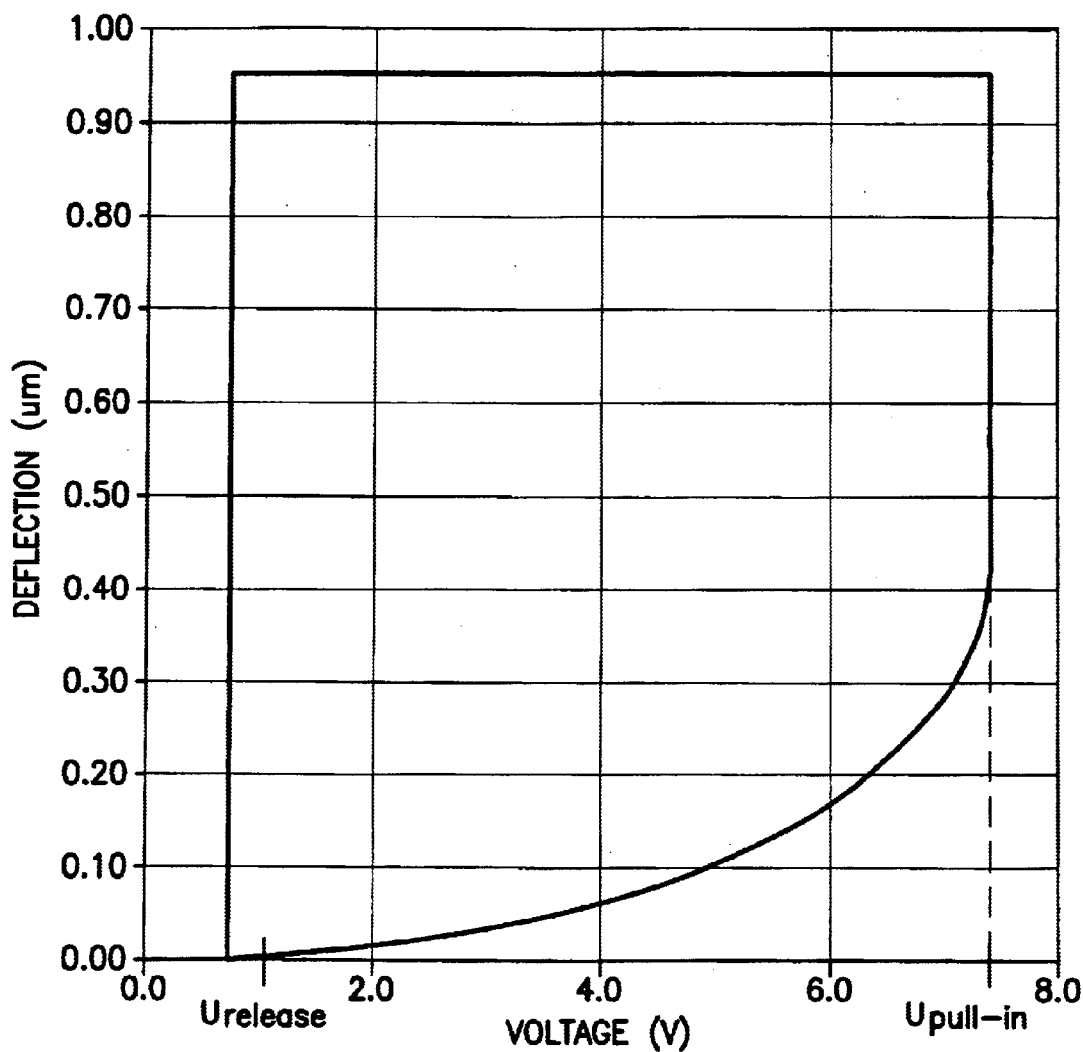
FIG. 1 illustrates behaviour of deflection of the center point of the micromechanical variable capacitor plate as a function of tuning voltage.
Figure 2:
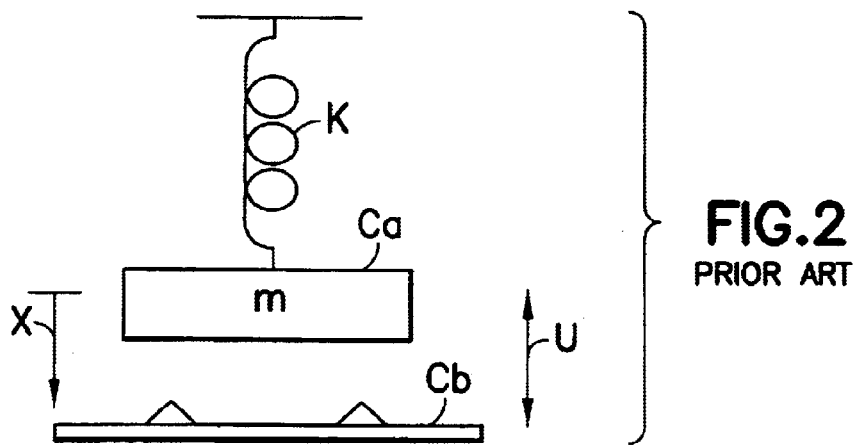
FIG. 2 illustrates a piston structure of a simplified micro-electro-mechanical system.

FIGS. 1 and 2 were explained above in describing the prior art.

Figure 3A:
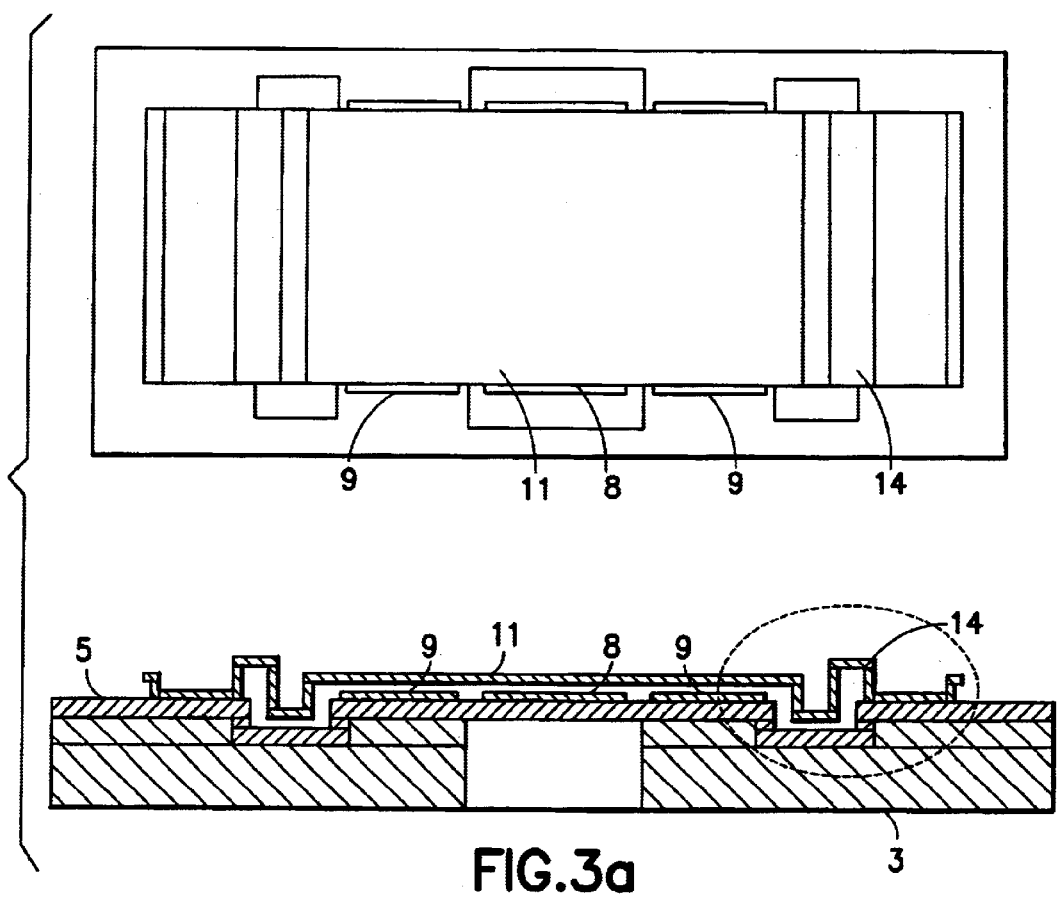
FIG. 3a illustrates an embodiment of the micromechanical capacitor of a resonator in accordance with the invention.
Figure 3B:
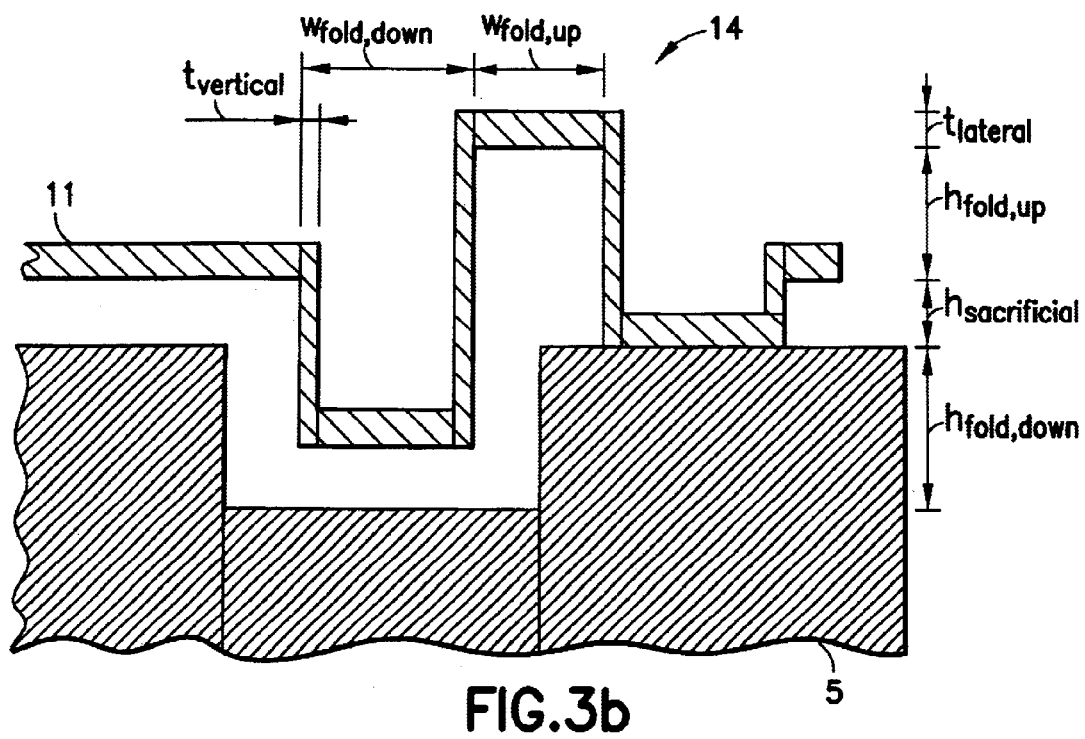
FIG. 3b illustrates an embodiment of the fold used to corrugate the film.

FIGS. 3a and 3b illustrate an embodiment of the micromechanical tunable capacitor. The structure can be modified to have different gap heights between the tuning electrodes and the beam than between the active electrode and the beam. The structure is a doubly-supported beam with the following key features:

the structure is fabricated on top of a conducting substrate 3, metal electrodes 8 and 9 are insulated from the substrate by a specific insulator layer 5, the metal electrodes are divided into tuning electrodes 9 and an active electrode 8, the substrate 3 is etched away under the active electrode 8 to reduce the capacitance between the active electrode and the substrate, and the flexible and elastic beam is corrugated 14 in order to reduce the effect of the mismatch between the thermal expansion of the substrate and the beam on the stress of the beam.

FIG. 3b illustrates the corrugation 14 of the electrode 11. Corrugation of the electrode reduces the temperature dependency of the system. The mismatch of the thermal expansion coefficients of the micromechanical structure 11 and the substrate 3 will be transferred into tension in the corrugation. Hence, the gap of the capacitor remains unchanged over a wide range of temperatures. The mechanical behaviour of the corrugation is determined by the characteristics of the material and the dimensions of the corrugation; width of the lower corrugation part $W_{fold,down}$, width of the upper corrugation part $W_{fold,up}$, height parameters of the layers $h_{fold,up}$, $h_{sacrificial}$, $h_{fold,down}$, thickness of the vertical part of the corrugation $t_{vertical}$ and thickness of the lateral part of the corrugation $t_{lateral}$. Vertical strips of the corrugation 14 can be made thinner than horizontal strips in a prerred embodiment, in order to reduce the horizontal spring constant of the corrugated electrode. In a preferable embodiment the electrode, typically a metal film beam or a diaphragm, has a markedly deeper corrugation than the lateral thickness of the film. This reduces the horizontal spring constant even further.

Figure 4A:
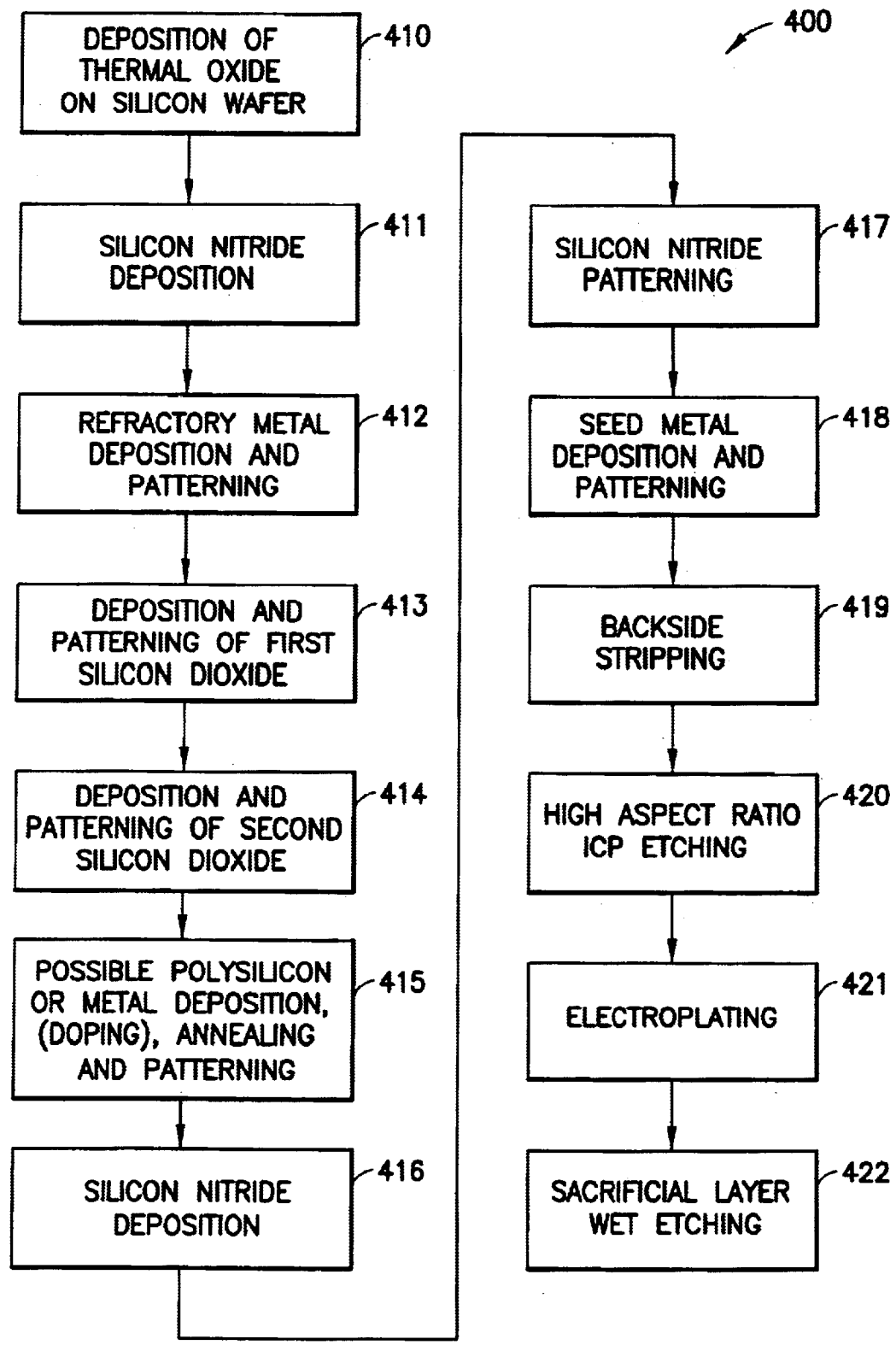
FIG. 4a illustrates a first embodiment of a method for producing the micromechanical RF resonator arrangement in accordance with the invention as a flow diagram.
Figure 4B:
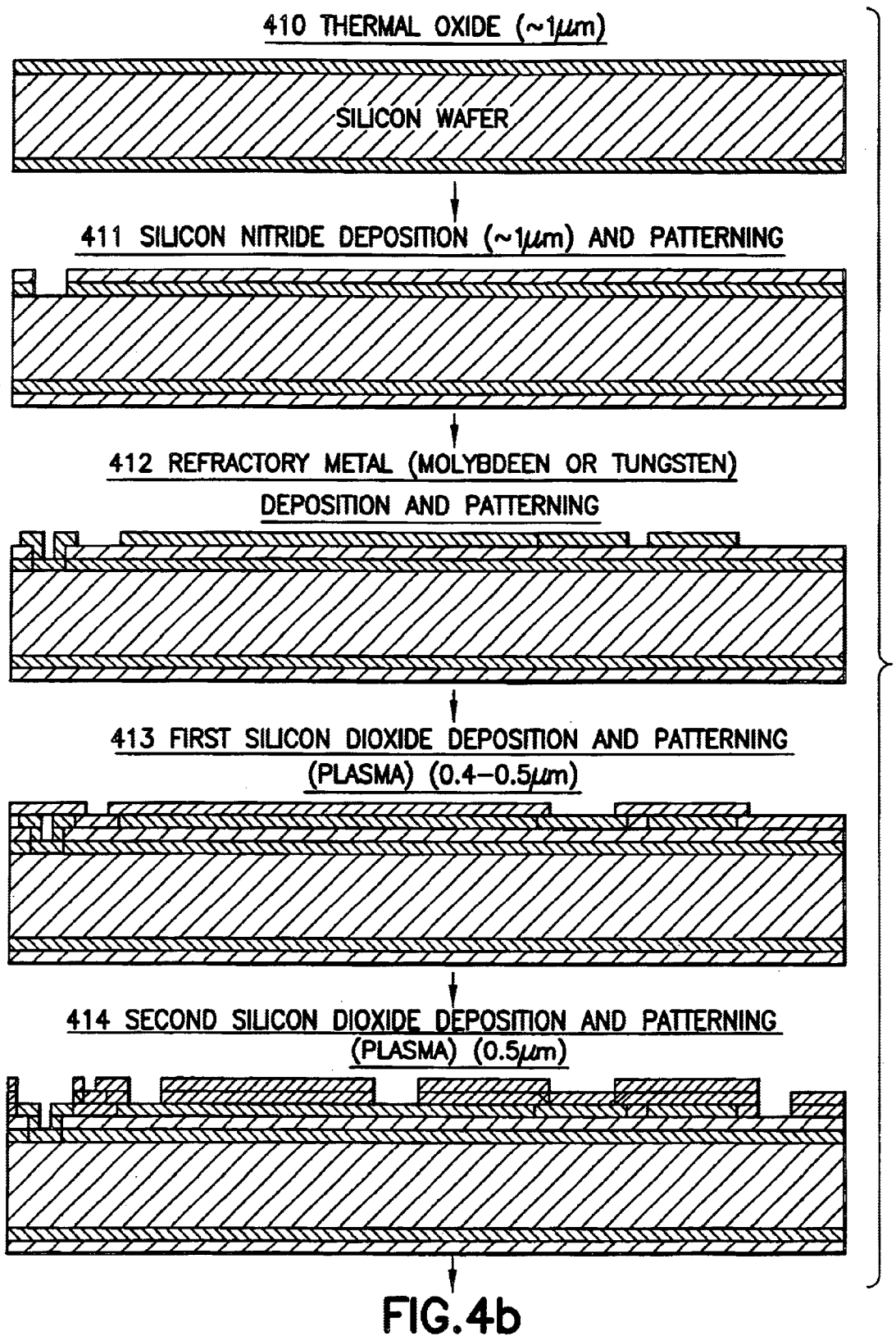
FIG. 4b illustrates a cross section of a production sample after phases 410–414 of the first embodiment of the production method according to the invention.
Figure 4C:
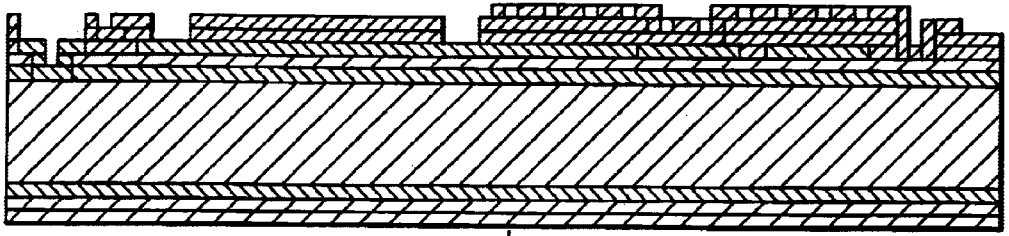
FIG. 4c illustrates a cross section of a production sample after phases 415–418 of the first embodiment of the production method according to the invention.
Figure 4C:
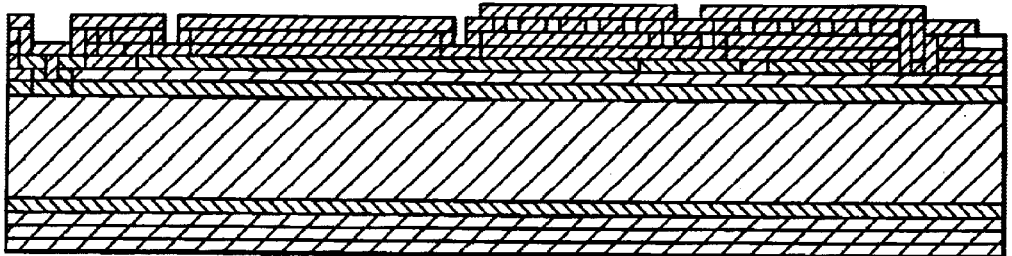
Figure 4C:
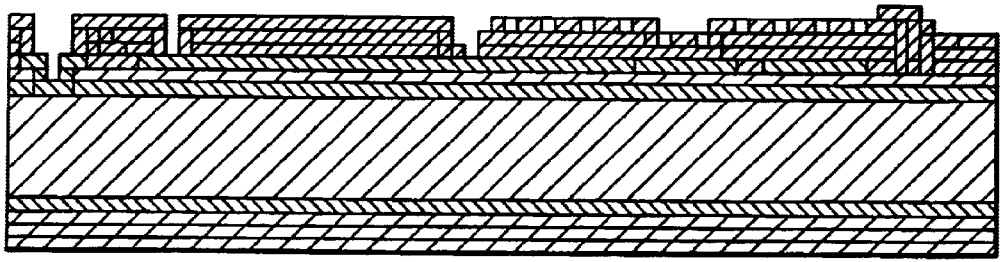
Figure 4C:
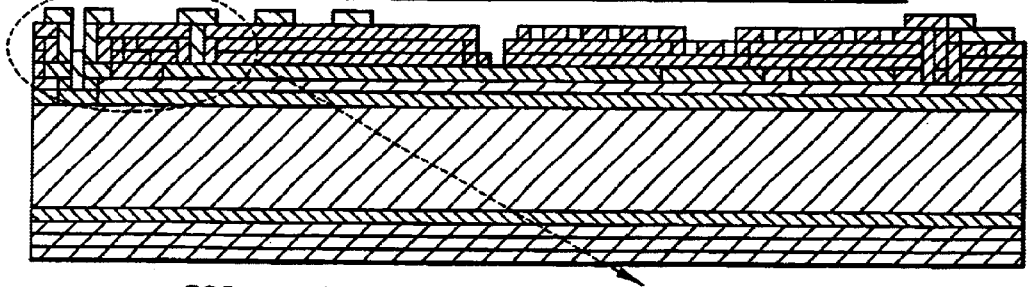
Figure 4D:
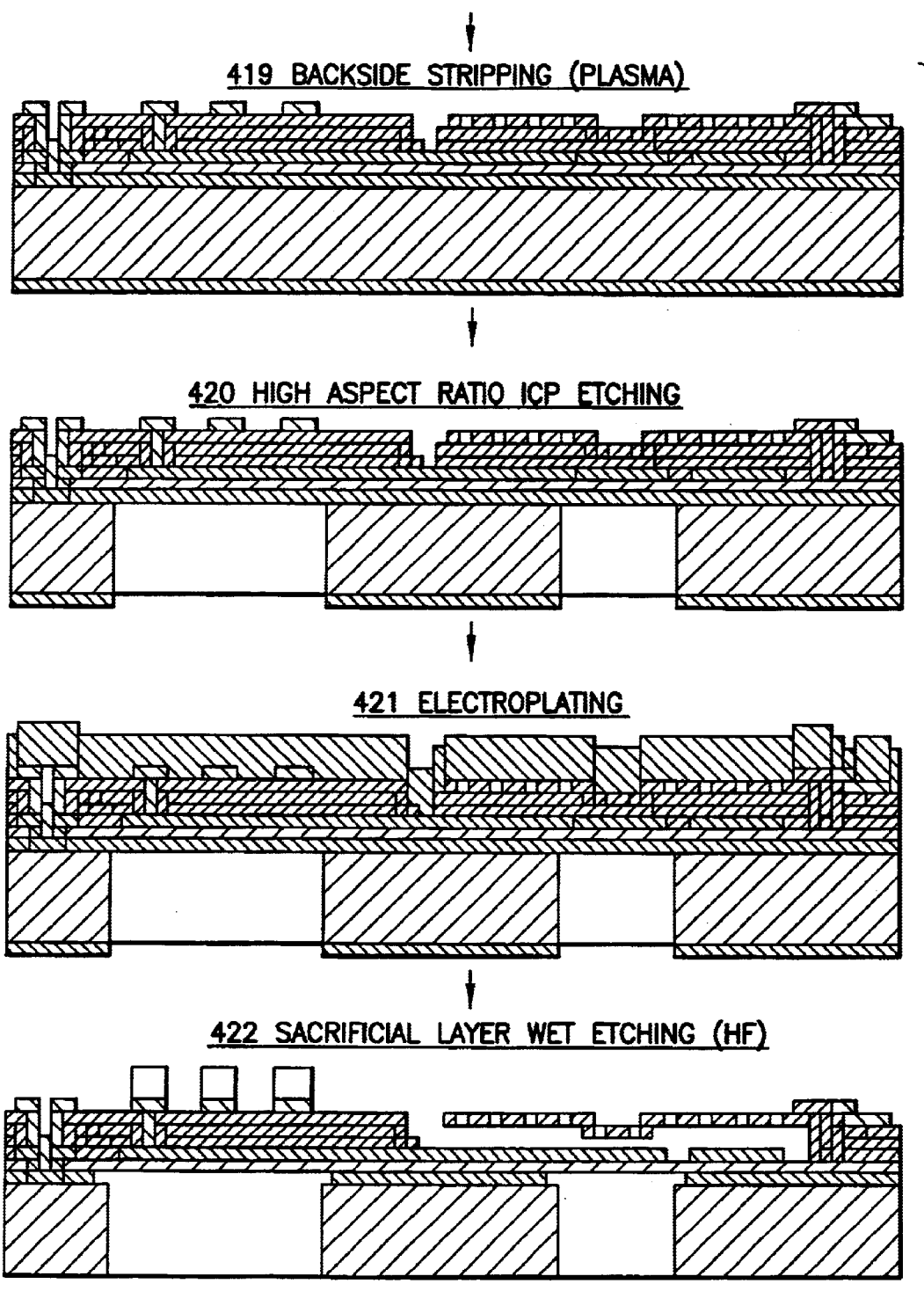
FIG. 4d illustrates a cross section of a production sample after phases 419–422 of the first embodiment of the production method according to the invention.

FIG. 4a shows a flow diagram of an examplary fabrication method in accordance with the invention. FIGS. 4b–4d further show cross sections of a production sample after each production phase. The detailed structures in FIGS. 4b–4d are not explained here as details are substantially the same as in FIG. 11a.

First, thermal oxide is deposited typically on a silicon substrate wafer in phase 410. Next typically silicon nitride is deposited in phase 411, and refractory metal is deposited and patterned in phase 412. Refractory metals (Mo, TiW) are preferred if the processing temperatures during the deposition of the sacrificial layer or any other following processing step is going to be high. In other case, the metal layer with higher conductivity such as Au, Al, or Cu are preferred in order to reduce the sheet resistance of the layer.

The first silicon dioxide deposition and patterning takes place in phase 413, and is followed by the second silicon dioxide deposition and patterning in phase 414. Polysilicon, polygermanium or metal (Al, Au, Cu, . . . ) is deposited, doped, annealed and patterned in phase 415. This is followed by nitride deposition in phase 416, and nitride patterning in phase 417. The aforementioned nitrides are typically silicon nitrides.

Seed metal is deposited and patterned in phase 418. The seed metal advantageously comprises several metal and semiconductor compound layers, some preferable alternatives include Cr, Au, Cu, CrTi and TiW. In some preferable embodiments the same conductor layer that forms the upper capacitor plate is used to create the seed layer for the inductor coil that is established by electroplating. This has a very favourable consequence, in that the electroplated inductor coil minimises the series resistance.

This phase is followed by plasma driven backside stripping 419. High aspect ratio ICP etching follows in phase 420, and electroplating in phase 421. Lastly sacrificial layer wet etching in phase 422 is conducted typically with HF (hydrogenfluoride). Silicon dioxide is a preferable sacrificial layer.

The process of FIGS. 4a–4d is based on the silicon dioxide sacrificial layer. This process has following advantages:

Thickness control and quality of the silicon dioxide film are sufficient for creating smaller gaps between the electrodes in the range of 500 nm;

Both polysilicon and metal films can be used as the mechanical structures. The deposition of polysilicon in step 415 can be replaced by metal film deposition. Furthermore the metal film deposition can be combined with the seed metal deposition of step 418;

The sacrificial layer can be used as a thick insulator layer for the coil, inter-connecting wires, and pads.

The process has a disadvantage of higher temperatures needed for silicon dioxide and polysilicon deposition and annealing. Thus a refractory metallization is needed: this leads to higher series resistance. Another disadvantage is related with the sacrifial layer HF etching: the copper films cannot be used for the upper metallization.

Figure 5A:
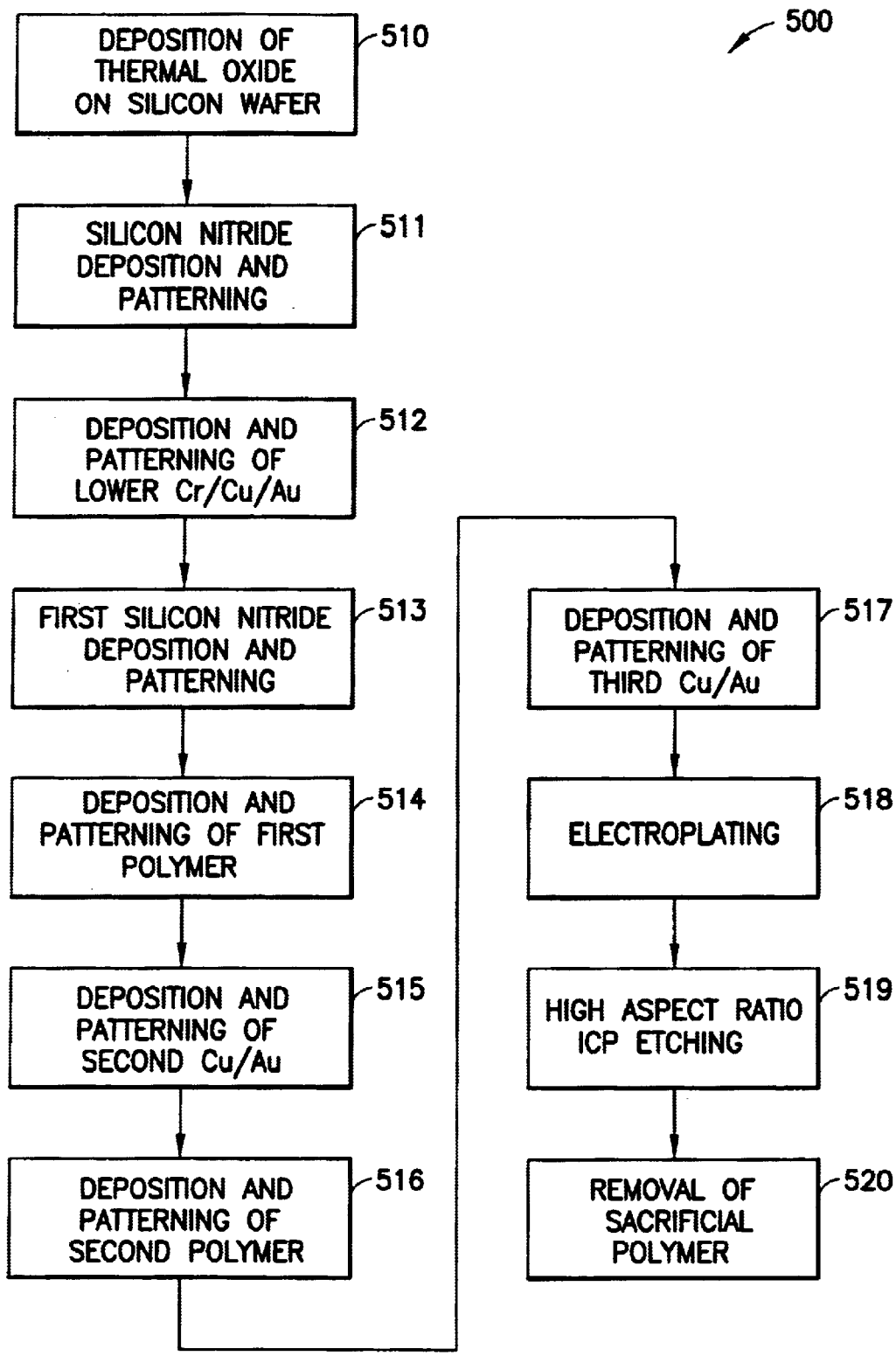
FIG. 5a illustrates a second embodiment of a method for producing the micromechanical RF resonator arrangement in accordance with the invention as a flow diagram.
Figure 5B:
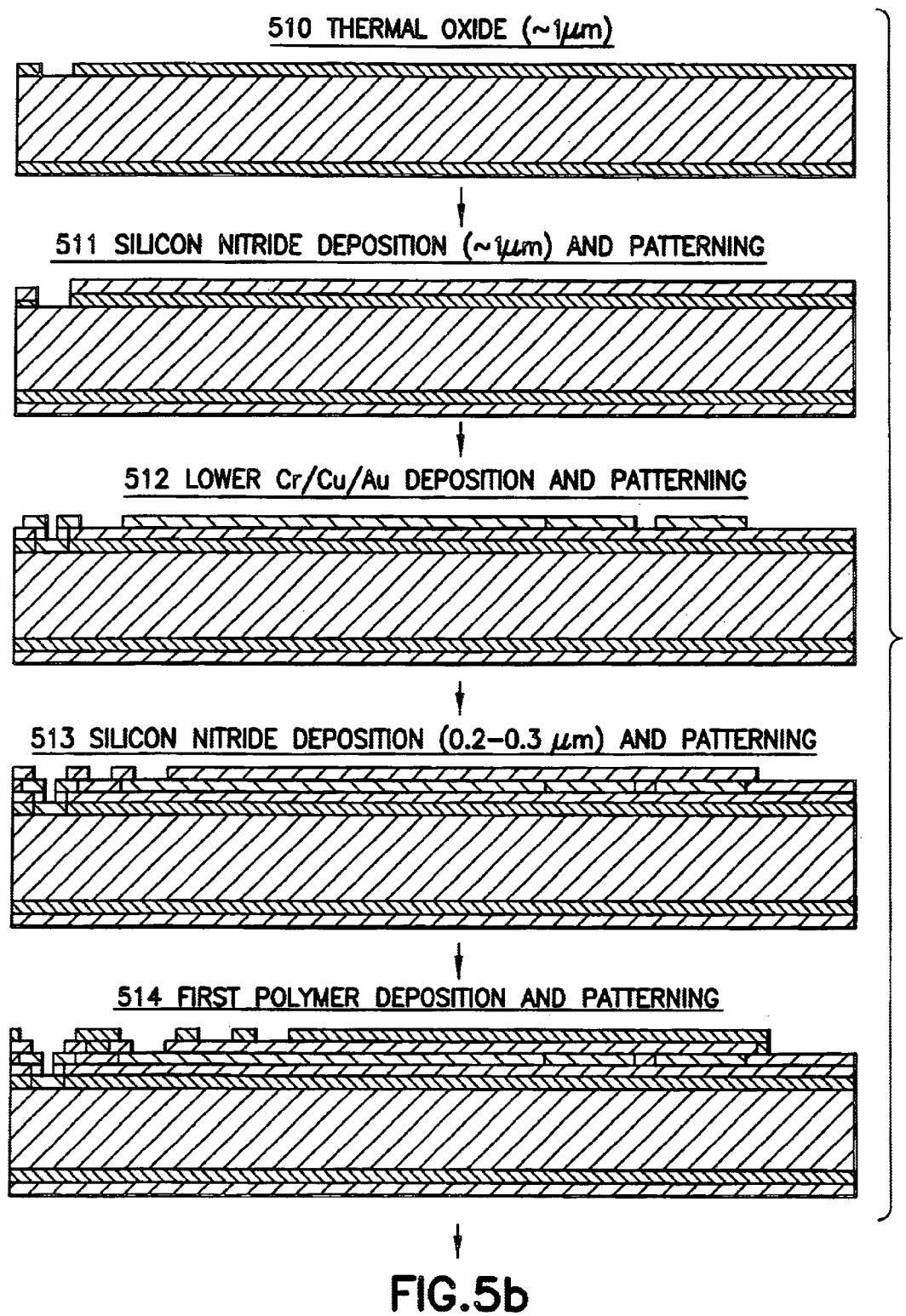
FIG. 5b illustrates a cross section of a production sample after phases 510–514 of the first embodiment of the production method according to the invention.
Figure 5C:
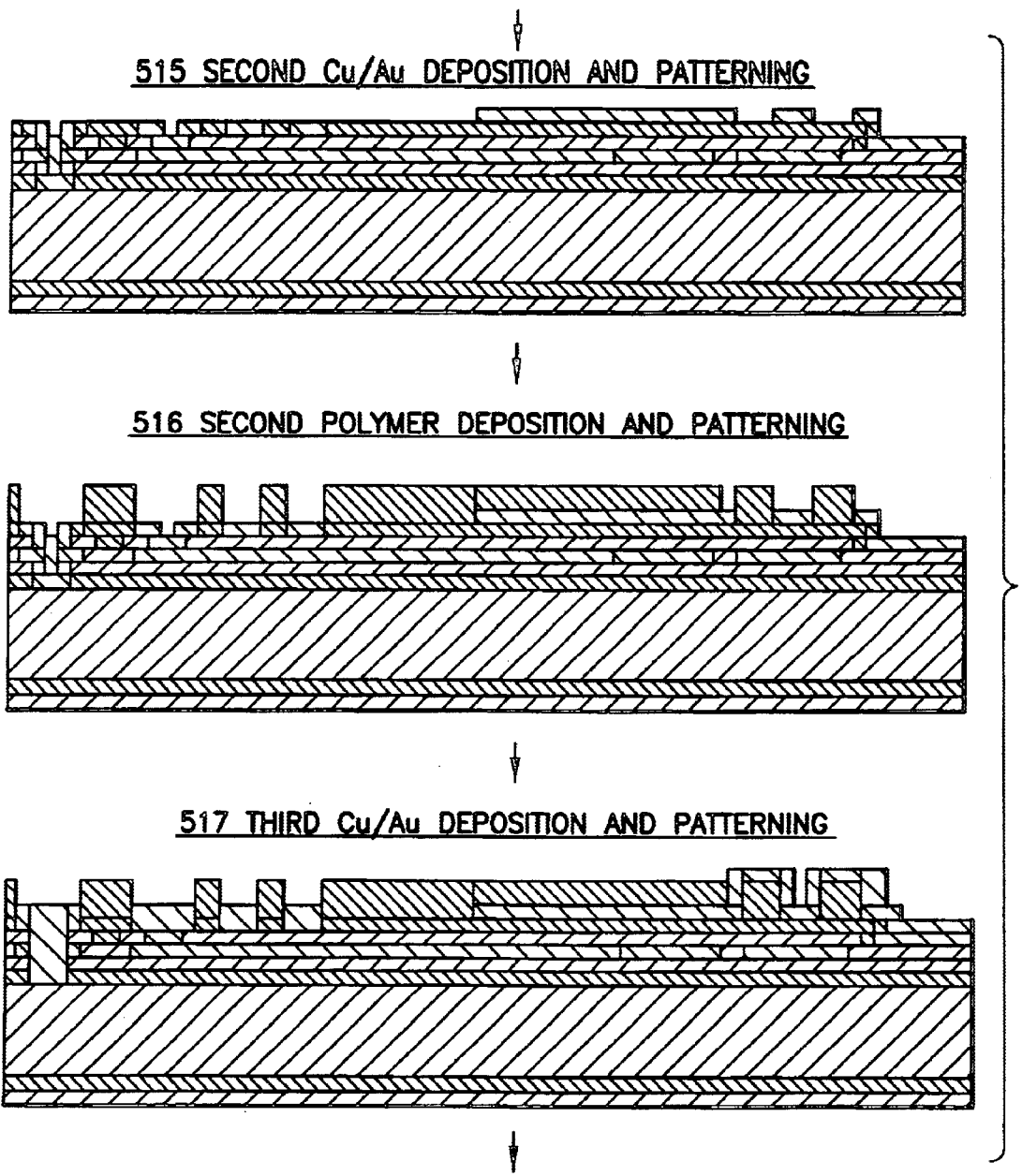
FIG. 5c illustrates a cross section of a production sample after phases 515–517 of the first embodiment of the production method according to the invention.
Figure 5D:
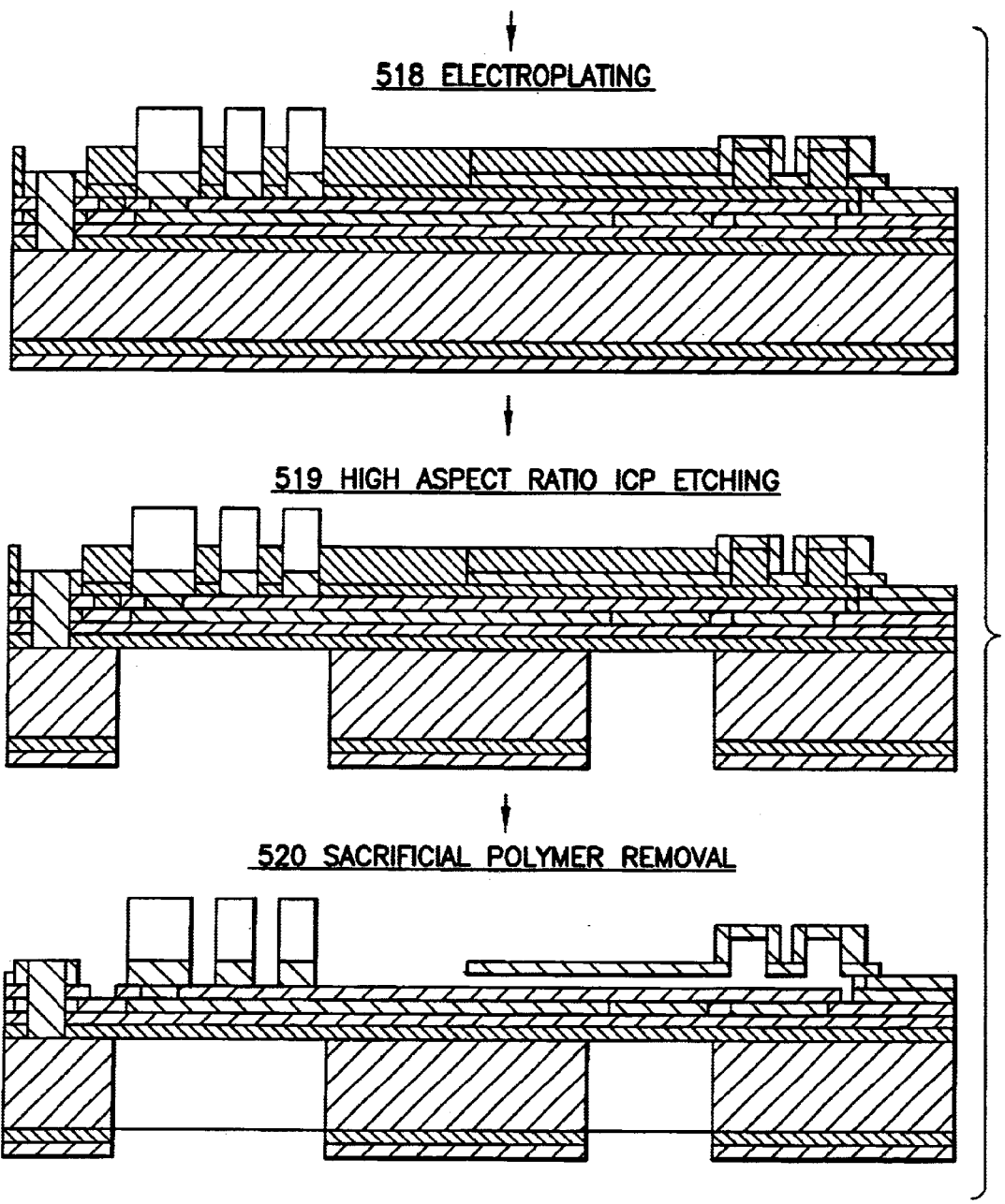
FIG. 5d illustrates a cross section of a production sample after phases 518–520 of the first embodiment of the production method according to the invention.

FIG. 5a shows a flow diagram of another examplary fabrication method in accordance with the invention. FIGS. 5b–5d further show cross sections of a production sample after each production phase. The detailed structures in FIGS. 5b–5d are not explained here as details are substantially the same as in FIG. 11a.

In FIG. 5a the thermal oxide is typically deposited on a silicon substrate wafer in phase 510, followed by typically silicon or other semiconductor nitride deposition and patterning in phase 511. Lower metal deposition and patterning takes place in phase 512. The metal used in this phase is typically Cr, Cu, Au or an alloy of them. Next the second silicon nitride deposition and patterning is performed in phase 513, followed by first polymer deposition and patterning in phase 514.

The second metal deposition and patterning takes place in phase 515, and is preferably followed by the second polymer deposition and patterning phase 516. The third metal deposition and patterning phase 517 preferably uses Cu or Au as the material, followed by electroplating in phase 518. In phase 519 the high aspect ratio ICP etching is conducted, and the sacrificial polymer is removed in phase 520.

The process of FIGS. 5a–5d is a low temperature process based on the use of polymer sacrificial layer. This process has following advantages:

Minimization of series resistance by the use of copper thin films for both two conductor layers;

Polymer sacrificial layer gives more possibilities for sacrificial layer thickness patterning in creating the corrugated structure;

The process is more simple;

The process is compatible with IC wafers as a post IC process;

It offers a possibility to use the sacrificial polymer layer also for the purpose of thick, low dielectric constant insulator film for the pads and the coil. Polymer dielectric constants are known to lower than for silicon dioxide.

The process of FIG. 5a and 5d can be also done on top of an insulating (ceramic or glass) substrate. In this case the process can be simplified because the substrate insulating layers and substrate removal are not needed. The similar rf resonator based on a tunable micromechanical capacitor can be realized on the insulation substrate.

Figure 6A:
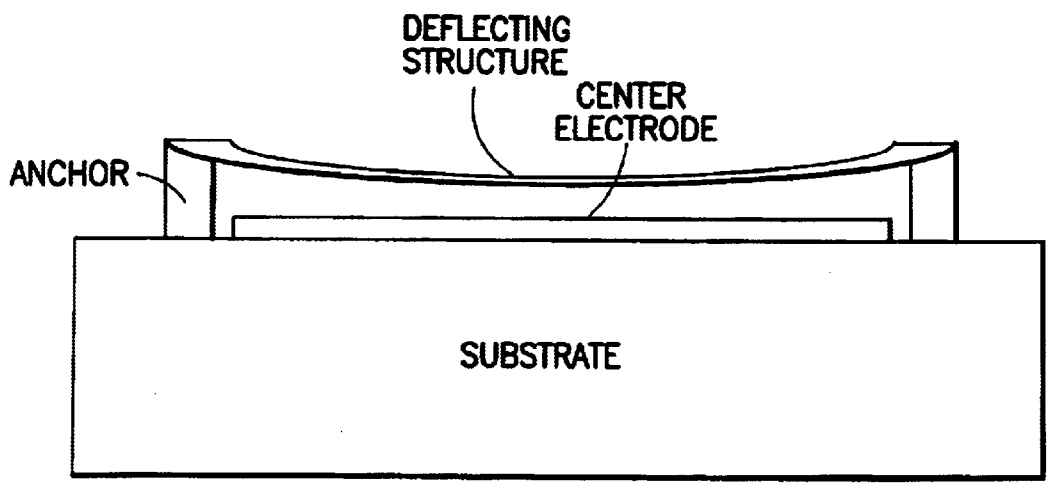
FIG. 6a illustrates a prior art tunable capacitor.

FIG. 6a illustrates a prior art tunable capacitor. The deflecting structure of the flexible electrode deflects towards the fixed counter electrode when an electric voltage is applied between the electrodes. The deflection pattern is determined by the balance of the electrostatic force and mechanical spring force of the deflecting structure. The deflection can be approximated by the simplified piston geometry shown in FIG. 2. The force balance between the mechanical spring force and the electrostatic force is created:

$$\sum F = F_{electric} + F_{mechanical} = \frac{\varepsilon_0 A U^2}{2(g_0 - x)^2} - \kappa x = 0, \tag{1}$$

where $g_0$ is the original gap value, x is the displacement from the rest position, U is the electric potential difference between the capacitor plates, $\kappa$ is the spring constant, A the capacitor area, and $\varepsilon_0$ is the dielectric constant. The electrostatic force increases inversely proportional to the square of distance between the plates and the mechanical force only directly proportional to displacement of the mass, see Eq. (1).

The system has instability when the mechanical spring force cannot sustain the electrical force as shown in FIG. 1. The pull-in or the collapse of the piston structure structure happens independent of dimensions of the structure when the gap is reduced to $$g = 2g_0/3 \tag{2}$$

and when the voltage is $$U_{pull-in} = \sqrt{\frac{8\kappa g_0^3}{27\varepsilon_0 A}} \tag{3}$$

According to Eq. (2), the maximum theoretical change in the voltage tuned plate capacitance is $$\frac{\Delta C}{C} = \frac{\frac{\varepsilon_0 A}{\frac{2}{3}g_0} - \frac{\varepsilon_0 A}{g_0}}{\frac{\varepsilon_0 A}{g_0}} = 50\%. \tag{4}$$

Thus for the voltage controlled tunable piston type capacitor is limited to 50% capacitance change due to the pull-in effect. In practice, the capacitance change is lower because of the parasitic capacitance. Furthermore, for deflecting structures of FIG. 6a, like diaphragms or beams, the theoretical maximum relative change in capacitance is smaller than for the ideal piston type structure due to the curvature of the capacitor plate.

Figure 6B:
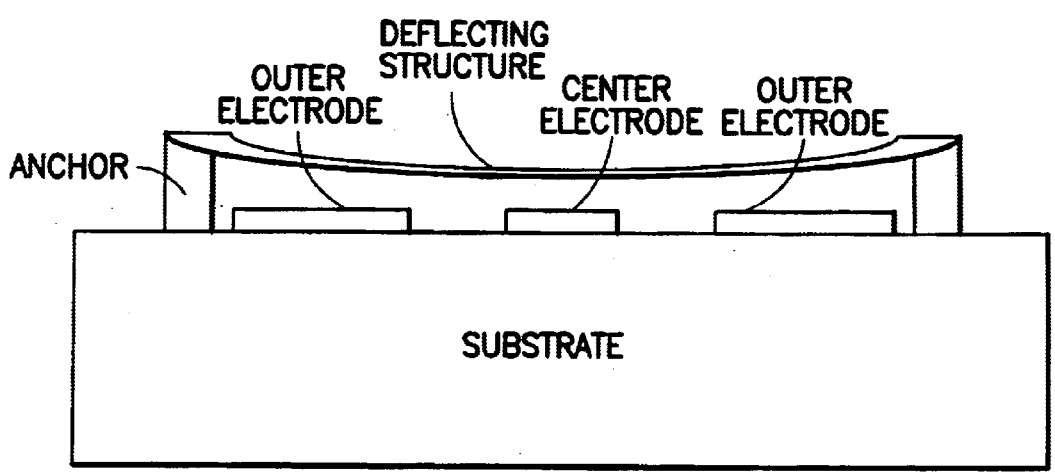
FIG. 6b illustrates an embodiment of the tunable micromechanical capacitor arrangement with separate tuning and active electrodes in accordance with the invention.

FIG. 6b illustrates a preferable embodiment of the inventive tunable capacitor. The active electrode is situated in the center of the gap between the anchors, where the deflection of the flexible electrode is the largest.

The maximum deflection of the capacitor of FIG. 6b is limited by the distance between the tuning electrodes and the deflecting structure. The minimum distance between the tuning electrodes and the deflecting structure is limited to $2g_0/3$. However, the distance between the active center electrode and the deflecting structure can be smaller because of the deflection pattern of the flexible electrode. Hence the relative change in capacitance can be clearly higher than 50%.

Figure 6C:
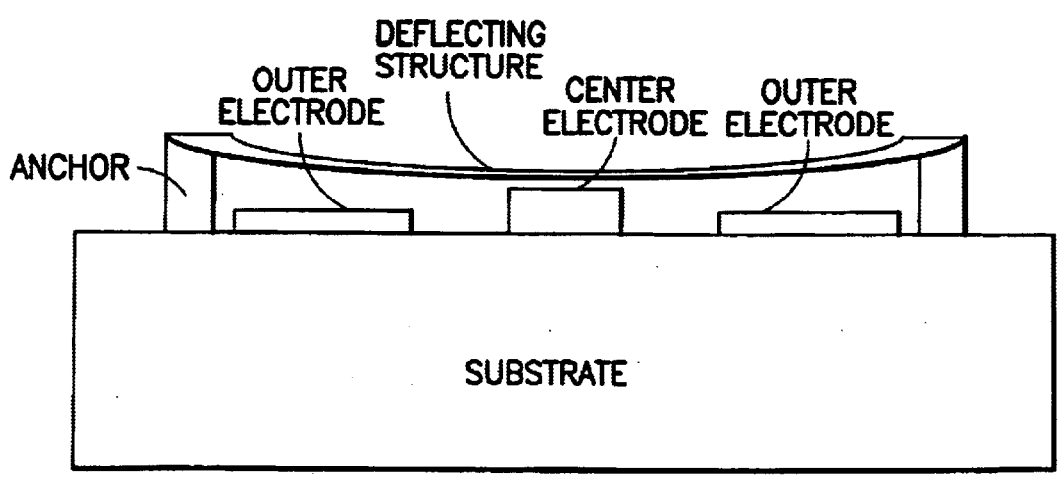
FIG. 6c illustrates a second embodiment of the tunable micromechanical capacitor with separate tuning and active electrodes with unequal gaps in accordance with the invention.

FIG. 6c illustrates a preferable embodiment of the inventive tunable capacitor that is otherwise similar to the embodiment of FIG. 6b but the air gap between the active center electrode and the flexible electrode is smaller than the air gap between the tuning outer electrodes and the flexible electrode. This makes the relative change of the active capacitance much higher, ΔC/C over 500% is possible.

Figure 7A:
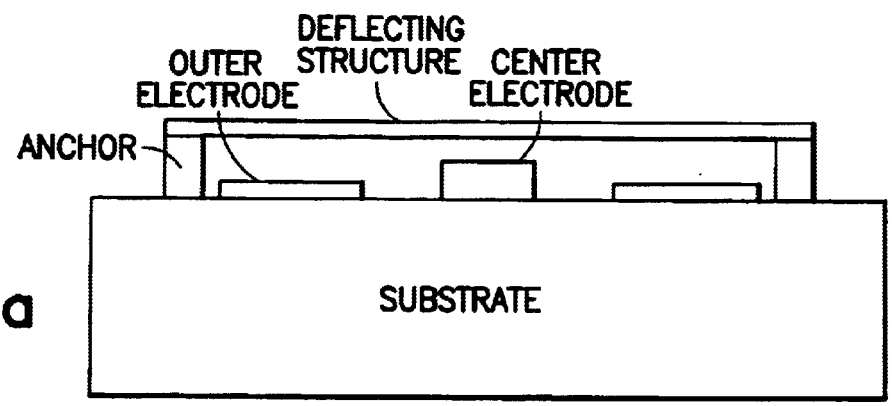
FIG. 7a illustrates a third embodiment of the tunable capacitor in accordance with the invention.
Figure 7B:
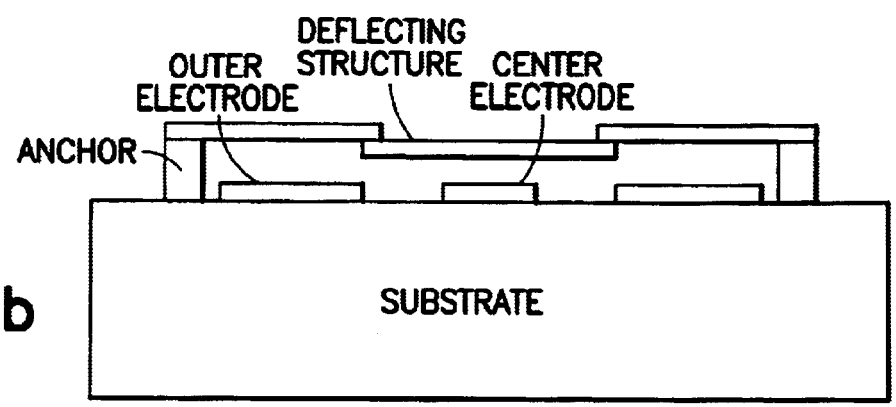
FIG. 7b illustrates a fourth embodiment of the tunable capacitor in accordance with the invention.
Figure 7C:
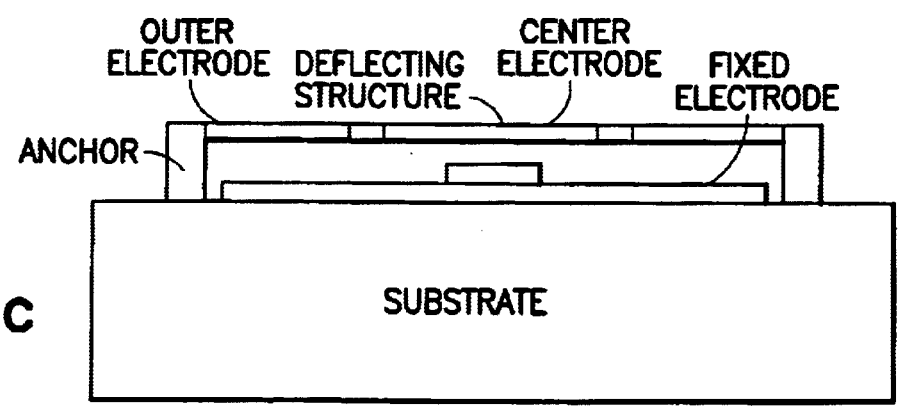
FIG. 7c illustrates a fifth embodiment of the tunable capacitor in accordance with the invention.
Figure 7D:
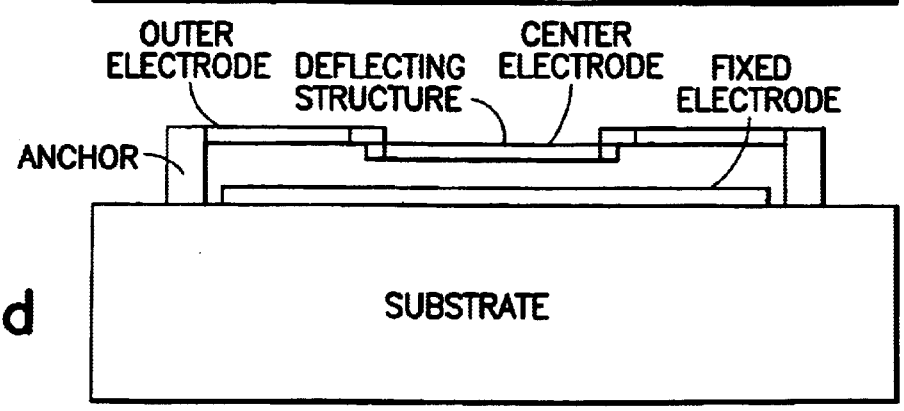
FIG. 7d illustrates a sixth embodiment of the tunable capacitor in accordance with the invention.

FIGS. 7a, 7b, 7c and 7d illustrate different embodiments of the tunable capacitor with divided electrode structure and different gap heights. In FIGS. 7a and 7b the division of the electrodes is done in the fixed structure. In FIGS. 7c and 7d the division of the electrodes is done in the flexible deflecting structure. The division of the flexible structure can be made in practise by two different ways:

by patterning the doping of the flexible structure and thus creating conducting and insulating regions, or by using insulating flexible structure and depositing conducting electrode on it.

An alternative embodiment according to the invention can be realized based on the micromachining of bulk silicon. The basic realization of the bulk micromechanical structure can be fabricated on top of borosilicate glass substrate. The deflecting diaphragm can be fabricated by either deep reactive ion or wet (typically KOH or TMAH) etching of silicon wafer. The glass and silicon structures are connected together by anodic bonding. The geometries and configurations of FIGS. 6b and 6c can be thus fabricated. One problem is how to bring the electrical connections to the metal electrodes to bonding pads for which at least the following two different solutions exist. The connection can be brought to the pads using wiring scheme and having the leads on the glass surface, or another way is to produce a via (preferably metal or silicon) through the glass substrate. An example of this kind is shown in FIGS. 8a and 8b.

Figure 8A:
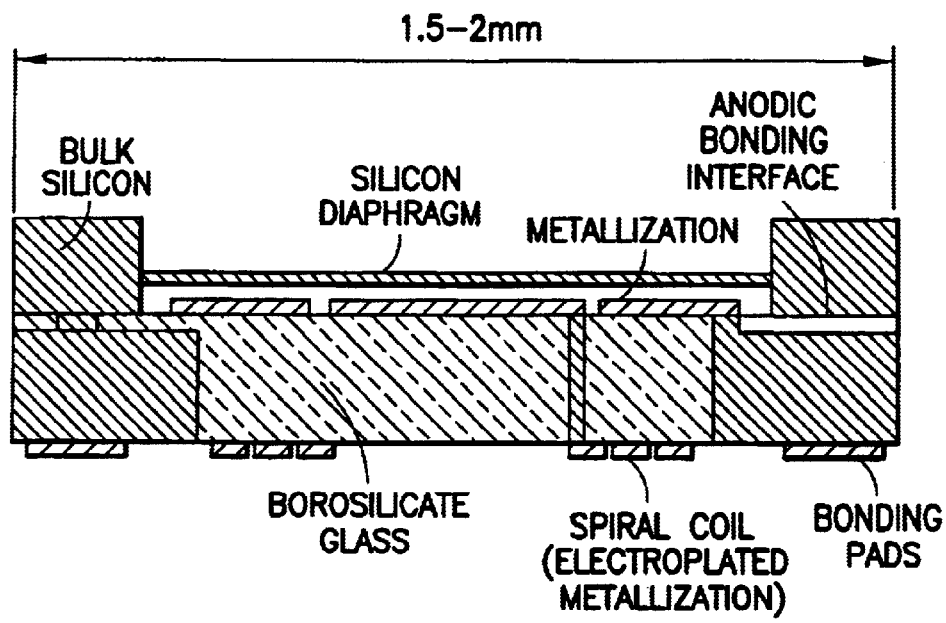
FIG. 8a shows an example of a bulk micromachined realization.
Figure 8B:
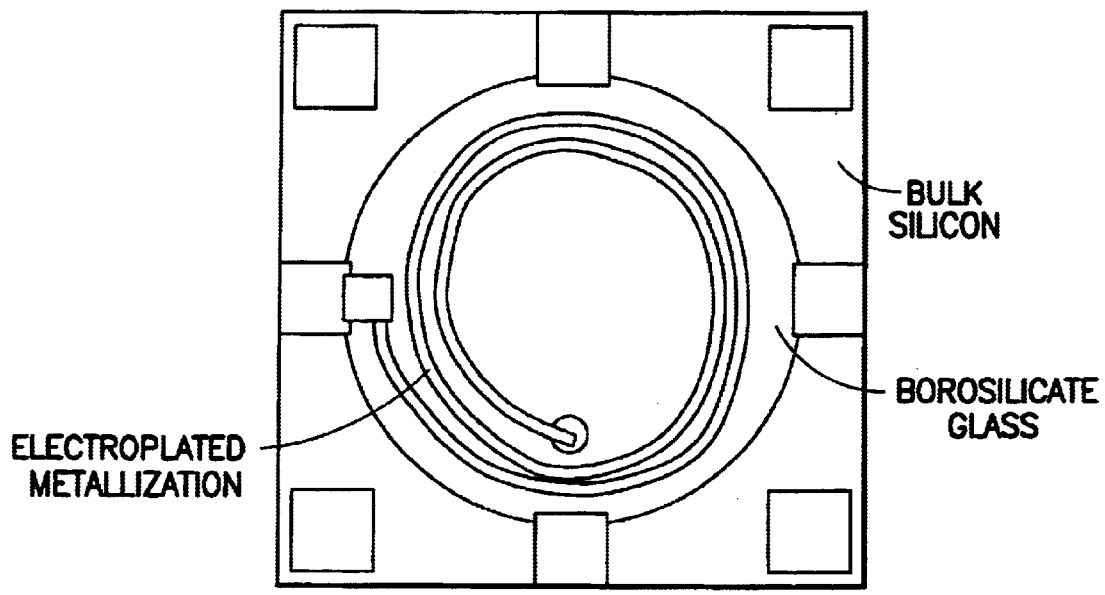
FIG. 8b shows the spiral, planar coil on the glass surface.

FIG. 8a shows an example of a bulk micromachined realization. The realization is based on the prior known micromechanical process (VTI Hamlin). The essential feature of the structure is the possibility to fabricate borosilicate glass through the silicon wafer. This is based on deep reactive ion etching of silicon and glass melting. However, this particular realization of FIG. 8a has certain new features:

divided metallization structure so that the feedthrough to the center electrode is created utilizing silicon via through the glass area. The thickness of the center electrode can be made larger than outer electrode to receive smaller gap for the center electrode, and integration of a spiral, planar inductor on the surface opposite of the capacitor diaphragm on top of the glass layer. The benefit is the improved Q value of the planar coil because of the low substrate losses in glass substrate compared to silicon substrate. FIG. 8b shows the spiral, planar coil on the glass surface.

In the surface micromachined structure, a further key problem is the minimization of the parasitic capacitance between the hot electrode of the capacitor and the substrate ground potential. For this particular reason, the most favorable way is to have the divided electrode structure as the top electrode, as shown in FIG. 9.

Figure 9:
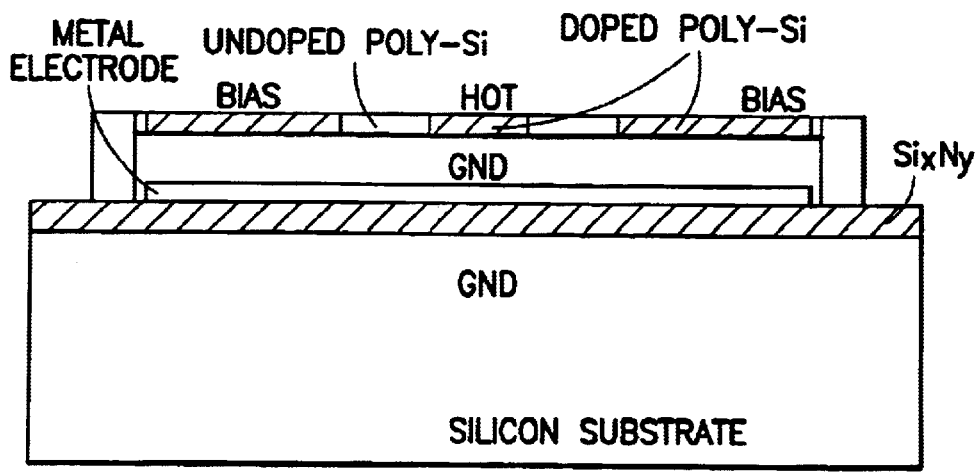
FIG. 9 shows a structure based of a deflecting (or bending) diaphragm that is anchored at all four sides, FIG. 10a, b shows a possible layout of the surface micromachined chip of bending diaphragm type.

FIG. 9 shows a structure based of a deflecting (or bending) diaphragm that is anchored at all four sides. The poly-Si divided electrode structure can be realized by patterning the doping of film, as shown in FIG. 9. The ratio of the square resistances of the undoped poly-Si and doped poly-Si can be as high as $10^9$. For phosphorus doped poly-Si the sheet resistance can in the best case be as low as 5 ohms/square.

Figure 10B:
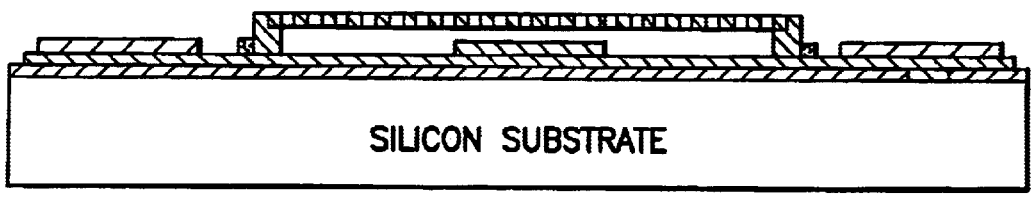
FIG. 10c shows another possible layout of the surface micromachined chip of bending diaphragm type.
Figure 10A:
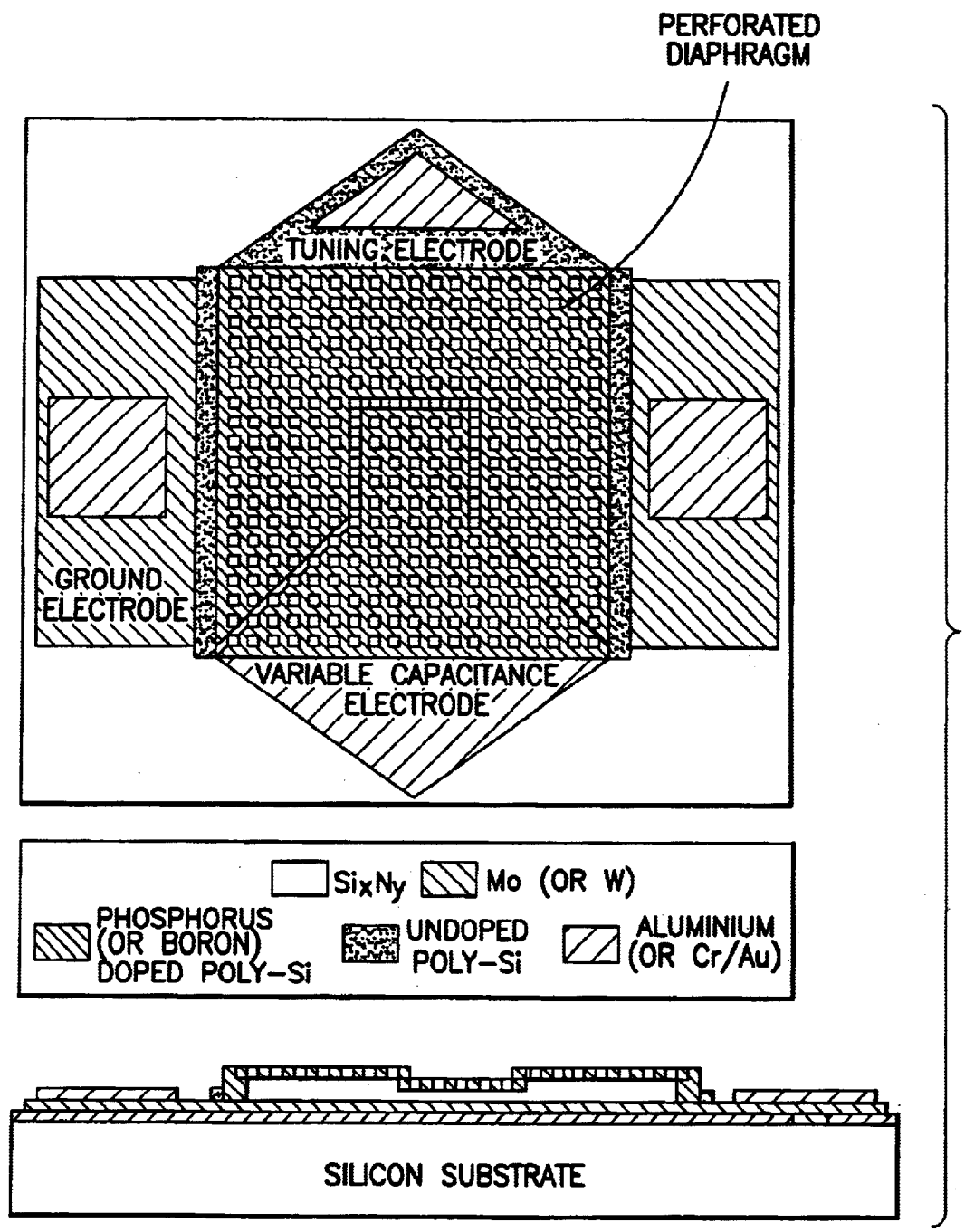

FIG. 10a,b shows a possible layout of the surface micromachined chip of bending diaphragm type. The upper poly-Si diaphragm is patterned by doping to form two distinct electrodes. Two alternative ways of realizing a variable gap height are shown in cross sections a) and b).

The optimization of the layout of FIG. 10a,b is done by the following criteria:

enhancing the capacitance tuning range by separating the tuning capacitance and the actual variable capacitance, minimizing the parasitic capacitance from the variable capacitance electrode to the ground electrode and to the substrate, and minimizing the series resistance in the doped poly-Si variable capacitance electrode.

Figure 10C:
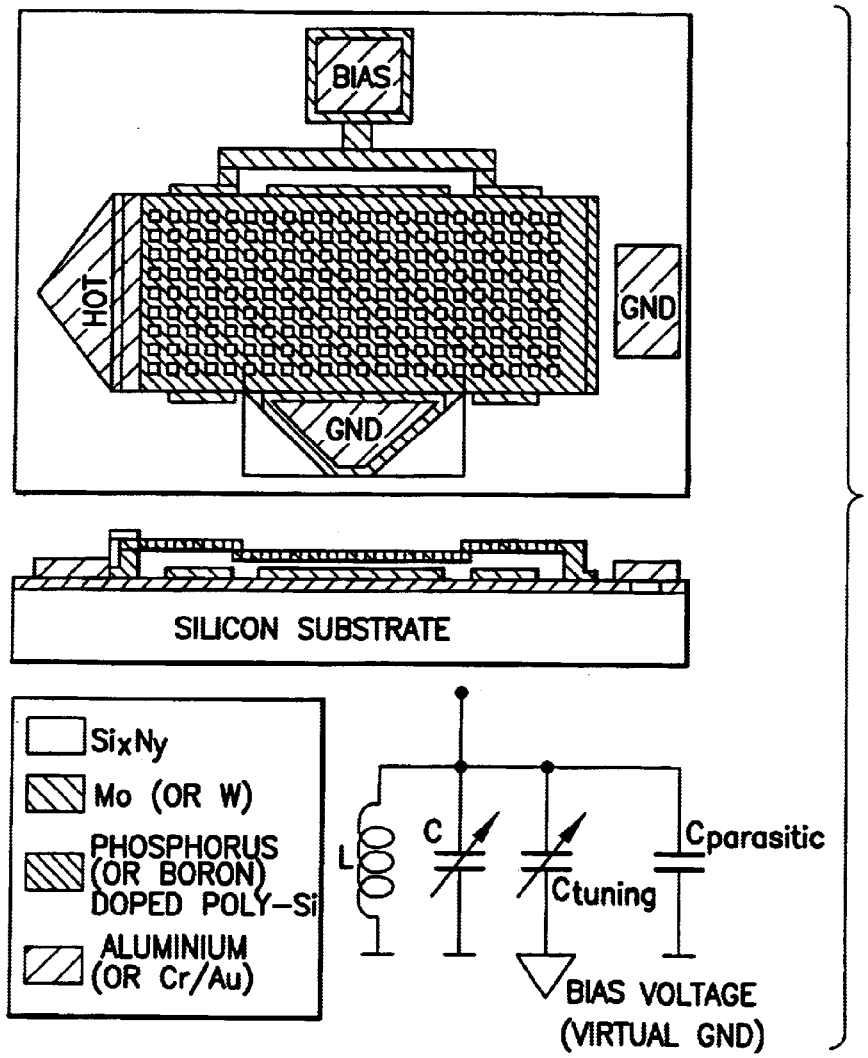

A cross section of an alternative surface-micromachined structure is shown in FIG. 10c. The structure is a flexural beam that is supported and clamped from the two opposite sides. The other two sides are free.

The structure of FIG. 10c utilizes following ideas:

the upper poly-Si beam is used as the hot rf electrode and the ground electrode is patterned on the substrate side, and the poly-Si electrode is dc grounded by the inductor coil of the resonator.

Thus the tuning capacitor is created between the bias electrode and the hot rf electrode.

The upper poly-Si electrode is fabricated so that its center part is lower than the sides. This improves the capacitor tuning area and makes the system smaller.

The advantages of the structure of FIG. 10c compared to the structure of FIG. 10a,b are:

larger capacitance tuning range, smaller size, easier to fabricate, and lower tuning voltages needed.

However, the parasitic capacitance is slightly higher.

Figure 11A:
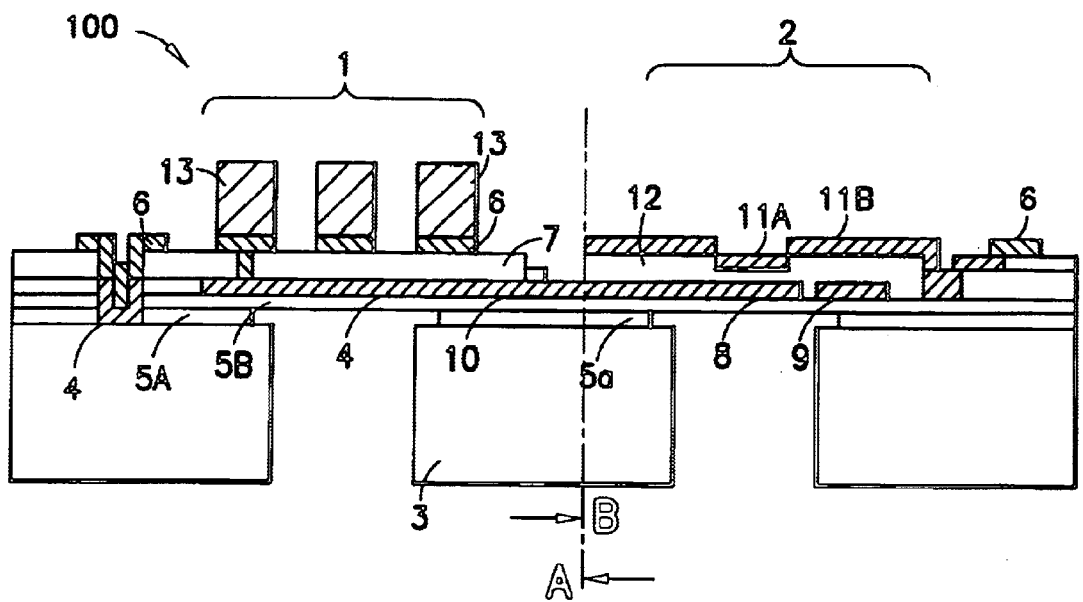
FIG. 11a illustrates a cross section of a first examplary micromechanical RF resonator in accordance with the invention.
Figure 11B:
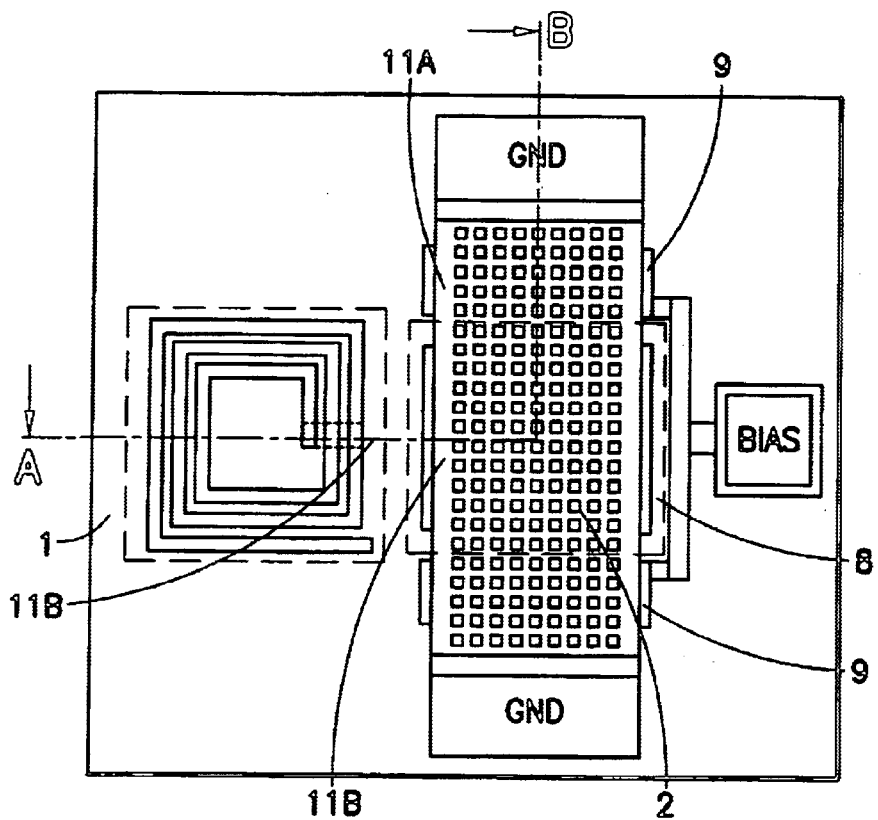
FIG. 11b illustrates a top view of the first examplary micromechanical RF resonator in accordance with the invention.

FIG. 11a illustrates a cross section of a first embodiment of the micromechanical RF resonator in accordance with the invention. FIG. 11b illustrates a top view of the first RF resonator embodiment. One should note that the cross section that is shown in FIG. 11a shown along the dash lines A–B of FIG. 11b.

The RF resonator comprises an integrated inductor 1 and a micromechanical tunable capacitor 2 that are produced on a substrate 3. The arrangement further comprises two dielectric substrate insulating layers 5a and 5b between a first conducting layer 4 and the substrate 3. A first dielectric insulating layer 7 is situated between the first conducting layer 4 and a second conductive layer 6. The first conducting layer 4 forms a first capacitor electrode 8. The first conducting layer 4 also forms another electrode 9 for tuning the capacitor. The capacitor further comprises a second movable electrode 11a, 11b. A voltage is applied between the electrodes 9 and 11b in order to create the electrostatic force needed in adjusting the movable micromechanical electrode 11a, 11b of the capacitor 2.

Parasitic capacitance is substantially reduced by using the micromechanical electrode 11a, 11b as the grounded electrode, i.e. the electrode is connected to the same electrical potential as the substrate 3. The fixed parts of the micromechanical structure are not creating parasitic capacitance, and hence the tuning range is improved. The use of metal thin films reduces the series resistance in the capacitor structure.

The planar inductor coil is formed by the third conducting layer 6, and a fourth electroplated conducting layer 13 on top of the conducting layer 6. The first conducting layer 4 may form the interconnecting wire 10 between the inductor coil 1 and the capacitor electrode 8. Using parts of conducting layer 4 as the interconnecting wire 10 reduces the number of necessary contacts between different metal layers.

In a preferred embodiment the gap 12 between the capacitor electrodes 8 and 11 is an air gap. The first dielectric layer 7 is advantageously used as a sacrificial layer in creating the air gap 12.

The arrangement for the micromechanical tunable capacitor 2 thus comprises one counter electrode 4 on one plate of the capacitor, and at least one active electrode 11a and at least one tuning electrode 11b on the other capacitor plate. The active electrode 11a is the electrode through which the RF signal is arranged to be fed. The dielectric gap 12 may be arranged to be narrower between at least one active electrode 11a and at least one counter electrode 8 than between at least one tuning electrode 11b and at least one counter electrode 9. The divided electrode structure of the capacitor arrangement 2 reduces the gap 12 from just above the actual variable capacitance. This substantially improves the tuning range of the capacitor arrangement 2.

In some preferable embodiments some or all of the substrate 3 is removed under the first capacitor electrode 8 of the capacitor structure 2, and also some or all of the substrate 3 can be removed under the planar inductor coil 1. The substrate is advantageously removed at the location where the capacitor 2 forms the actual variable capacitance, because the parasitic capacitance is thus reduced. The substrate removal is preferably done with isotropic or anisotropic etching, from either side of the substrate wafer 3. Parasitic capacitance is even further reduced if the substrate is etched wholly or partly where the coil 1 is located. This substrate removal may be executed simultaneously and with the same means and methods as the substrate removal at the location of the electrode 8 of the capacitor arrangement 2. The dielectric insulating layer 5 is arranged as a supporting structure for the capacitor electrode 8 and the planar inductor coil 1.

Following materials can preferably be used for providing the conductive layers:

The first conducting layer 4 can be
  refractory metal, such as Mo, W, TiW,
  metal, such as Au, Cu or
  doped electrode in bulk Si.
The second conducting layer 11a, 11b can be
  metal, such as Au, Cu,
  polysilicon or
  monocrystalline silicon.
The third conducting layer 6 can be metal, such as Cu or Au. The third conducting layer is preferably an electroplated layer, the thickness of which is substantially larger than the thickness of first and second conducting layers.

Figure 12:
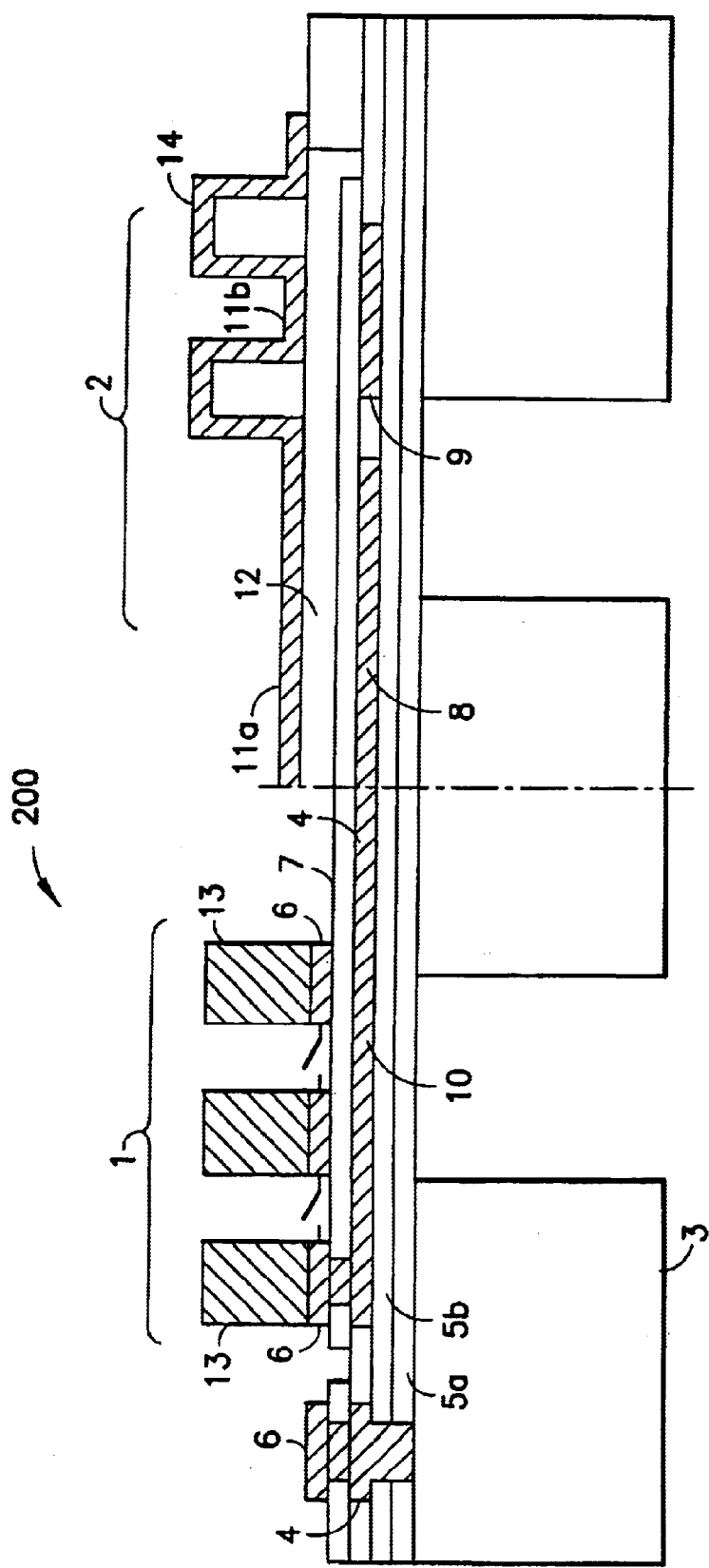
FIG. 12 illustrates a cross section of a second examplary micromechanical RF resonator in accordance with the invention.

FIG. 12 illustrates a second embodiment of a resonator according to the invention. The resonator comprises most of the same parts as the first embodiment of FIGS. 11a and 11b. However, the second capacitor electrode 11b is folded and or corrugated 14 to at least two levels with respect to the first capacitor electrode 8. In some preferable embodiments the vertical portions of the folds and/or corrugates 14 can be fabricated thinner than the lateral portions of the second capacitor electrode 11b.

In the suggested micromechanical tunable RF resonator comprising an integrated inductor and a micromechanical tunable capacitor connected in series or parallel, integrated inductor can be also tunable. The tunable inductor consists of integrated inductor (planar, solenoid or other types) divided into segments and MEMS switches are connected in parallel with the inductor segments. Every segment can be short circuited by corresponding MEMS switch to form an inductance having a particular inductance value. The MEMS switches have insertion loss as low as 0.1 dB at high frequencies; so that placing one or more switches in series with a given inductor allows to reduce negative effect of switches on Q factor of the inductor and hence the resonator. The MEMS switch can be realized by the same process flow used for creating the capacitor and inductor structures.

The invention has been explained above with reference to the aforementioned embodiments, and several industrial advantages of the invention have been demonstrated. The arrangement for an integrated tunable resonator for radio use and means for fabricating the same in accordance with the invention presents an integrated tunable resonator with improved tuning range and with minimized series resistance, parasitic capacitance and the temperature dependency. The invention thus presents a substantial improvement to the linearity, power consumption, occupation space and reliability of RF resonator circuits and systems based on LC resonators. Thee inventive idea of the tunable capacitor is not restricted to be used in a resonator, but it can be applied also in many other purposes.

The invention has been explained above with reference to the aforementioned embodiments. However, it is clear that the invention is not only restricted to these embodiments, but comprises all possible embodiments within the spirit and scope of the inventive thought and the following patent claims.

What is claimed is:

1. An integrated tunable RF resonator comprising an integrated inductor and a micromechanical tunable capacitor connected in series or in parallel, comprising
  a substrate (3),
  a substrate insulating layer (5),
  a first conducting layer (4) for forming a first capacitor electrode (8) and control electrodes (9) for applying a control voltage,
  a second conducting layer (6) for forming a second capacitor electrode (11a, 11b) that is movable relative to the first capacitor electrode (8);
  a third conducting layer for forming at least part of the inductor coil;
  wherein said control electrodes (9) are used to create an electrostatic force on said movable second electrode (11) for tuning the capacitance of the capacitor,
  characterized in that
  a dielectric insulating layer (7) is used to at least partly cover said first capacitor electrode (8) to prevent the galvanic contact between said first capacitor electrode (8) and said second capacitor electrode (11),
  wherein a portion of an exterior surface of said substrate (3) is at least partly removed at the location of the said inductor coil (1) and the said first capacitor electrode (8) and further wherein said substrate (3) is removed up to said first capacitor electrode or up to said substrate insulating layer (5)
  said substrate insulating layer (5) is arranged as a suspended structure for the said first capacitor electrode (8) and the semiconductor coil (1).

2. An integrated tunable RF resonator according to claim 1, characterized in that said substrate insulating layer is between the substrate and the first conducting layer.

3. An integrated tunable RF resonator according to claim 1, characterized in that the first conducting layer forms an interconnecting wire between the inductor coil and the capacitor electrode.

4. A micromechanical tunable capacitor according to claim 1, characterized in that, the said substrate is a semiconductor material.

5. An integrated tunable RF resonator according to claim 1, characterized in that the dielectric insulating layer (7) is preventing the galvanic contact between the first conducting layer (8) and the second conducting layer (6).

6. An integrated tunable RF resonator according to claim 1, characterized in that a portion of said second conducting layer is used for forming at least part of the inductor coil.

7. An integrated tunable RF resonator, according to claim 1, characterized that the moveable second capacitor electrode is electrically connected to the same potential as the substrate.

8. An integrated tunable RF resonator according to claim 1, characterized in that, a gap between the capacitor electrodes is an air gap.

9. An integrated tunable RF resonator according to claim 8, characterized in that the dielectric insulating layer is used as a sacrificial layer in creating the air gap.

10. An integrated tunable RF resonator, according to claim 1, characterized in that the dielectric insulating layer is used as a sacrificial layer to create an air gap between said first capacitor electrode and said second capacitor electrode.

11. An integrated tunable RF resonator according to claim 1, characterised in that said dielectric insulating layer on top of said first capacitor electrode covers the electrode only partly.

12. An integrated tunable RF resonator according to claim 1, characterized in that the dielectric insulating layer on top of said first capacitor electrode is silicon nitride.

13. An integrated tunable RF resonator according to claim 1, characterized in that the dielectric insulating layer on top of said first capacitor electrode is polymer.

14. An integrated tunable RF resonator according to claim 1, characterized in that the second capacitor electrode is the ground electrode.

15. An integrated tunable RF resonator according to claim 1, characterized in that the third conducting layer is metal film.

16. An integrated tunable RF resonator according to claim 1, characterized in that the material of which the first conducting layer is constructed is selected from the group consisting of one of the following materials:
- a refractory metal, selected from the group consisting of Mo, W or Tiw,
- a metal, selected from the group consisting of Au or Cu, or
- a doped electrode in bulk silicon.

17. An integrated tunable RF resonator according to claim 1, characterized in that the material of which the second conducting layer is constructed is selected from the group consisting of one of the following materials:
- a metal, selected from the group consisting of Au or Cu,
- polysilicon, or
- monocrystalline silicon.

18. An integrated tunable RF resonator according to claim 1, characterized in that the third conducting layer is metal.

19. An integrated tunable RF resonator according to claim 1, characterized in that the third conducting layer is a electroplated layer with a substantially larger thickness than the thickness of the first and second conducting layers.

20. An integrated tunable RF resonator according to claim 1, characterized in that the inductor coil comprises an electroplated metal layer on top of the third conducting layer.

21. An integrated tunable RF resonator according to claim 1, characterized in that the inductor coil is arranged to be adjustable.

22. An integrated tunable RF resonator according to claim 1, characterized in that the inductor coil has several segments, and it is arranged to be adjustable by means to change the number of active segments in the coil.

23. An integrated tunable RF resonator according to claim 1, characterized in that the segments of the inductor coil are changed by a micro-electro-mechancial switch realized in the same fabrication process with capacitors and inductors.

24. An integrated tunable RF resonator according to claim 1, characterized in that the inductor coil is a planar inductor coil.

25. A micromechanical tunable capacitor according to claim 1, characterized in that, said second capacitor electrode is metal thin film.

26. A micromechanical tunable capacitor according to claim 1, characterized in that the second capacitor electrode is folded and/or corrugated to at least two levels with respect to the first capacitor electrode.

27. A micromechanical tunable AF resonator according to claim 26, characterized in that the vertical portions of the folds and/or corrugates are fabricated thinner than the lateral portions of the second capacitor electrode.

28. A micromechanical tunable capacitor, comprising at least of one counter electrode forming a first plate of the capacitor, and at least one active electrode and at least one tuning electrode forming a second capacitor plate, said plates separated by a dielectric gap characterized in that,
- each of said electrodes is a metal film formed on a substrate (3),
- at least one of the capacitor plates is arranged to be a flexible and elastic structure,
- said electrodes on the other of said at least one capacitor plate is covered by an insulating layer (7) to prevent a galvanic contact between the said electrodes on the first and second capacitor plates; and
- wherein a portion of an exterior surface of said substrate (3) is at least partly removed at the location of said at least one active capacitor electrode (8), wherein said substrate (3) is removed up to said active capacitor electrode (8).

29. A micromechanical tunable capacitor according to claim 28, characterized in that the dielectric gap is arranged to be narrower between at least one active electrode and at least one counter electrode than between at least one tuning electrode and at least one counter electrode.

30. A micromechanical tunable capacitor according to claim 28, characterized in that said active electrode and said at least one tuning electrode are formed in the same layer.

31. A micromechanical tunable capacitor according to claim 28, characterized in that said capacitor plate having a flexible and elastic structure is electrically connected to the same potential as the substrate.

32. A micromechanical tunable capacitor according to claim 28, characterized in that a tuning signal is arranged to be fed through the tuning electrode.

33. A micromechanical tunable capacitor according to claim 28, characterized in said flexible and elastic capacitor plate is clamped from two opposite sides and that the active electrode is arranged to be positioned further from said opposite sides than at least one tuning electrode.

* * * * *

UNITED STATES PATENT AND TRADEMARK OFFICE
CERTIFICATE OF CORRECTION

PATENT NO. : 6,744,335 B2
DATED : June 1, 2004
INVENTOR(S) : Ryhanen et al.

It is certified that error appears in the above-identified patent and that said Letters Patent is hereby corrected as shown below:

Column 12,
Line 64, "semiconductor" should read -- inductor --.

Column 14,
Lines 8 and 9, "claim 1" should read -- claim 22 --.
Line 22, "AF" should read -- RF --.

Signed and Sealed this

First Day of February, 2005

JON W. DUDAS
*Director of the United States Patent and Trademark Office*